United States Patent
Moroz et al.

(10) Patent No.: US 10,756,212 B2
(45) Date of Patent: Aug. 25, 2020

(54) FINFET WITH HETEROJUNCTION AND IMPROVED CHANNEL CONTROL

(71) Applicant: Synopsys, Inc., Mountain View, CA (US)

(72) Inventors: Victor Moroz, Saratoga, CA (US); Stephen Smith, Mountain View, CA (US); Qiang Lu, Foster City, CA (US)

(73) Assignee: SYNOPSYS, INC., Mountain View, CA (US)

(*) Notice: Subject to any disclaimer, the term of this patent is extended or adjusted under 35 U.S.C. 154(b) by 40 days.

(21) Appl. No.: 16/145,049

(22) Filed: Sep. 27, 2018

(65) Prior Publication Data
US 2019/0043987 A1    Feb. 7, 2019

Related U.S. Application Data

(63) Continuation of application No. 14/925,777, filed on Oct. 28, 2015, now Pat. No. 10,121,896, which is a
(Continued)

(51) Int. Cl.
H01L 29/78    (2006.01)
H01L 29/66    (2006.01)
(Continued)

(52) U.S. Cl.
CPC ...... H01L 29/7848 (2013.01); H01L 27/0207 (2013.01); H01L 27/0924 (2013.01);
(Continued)

(58) Field of Classification Search
CPC ............ H01L 29/7848; H01L 27/0924; H01L 27/0207
See application file for complete search history.

(56) References Cited

U.S. PATENT DOCUMENTS 7,190,050 B2    3/2007 King et al.
2007/0235763 A1  10/2007 Doyle et al.
(Continued)

FOREIGN PATENT DOCUMENTS

CN    101924105 A    12/2010
CN    103137696 A    6/2013

OTHER PUBLICATIONS

PCT/US2014/44259—International Search Report and Written Opinion dated Oct. 21, 2014, 14 pages.
(Continued)

Primary Examiner — Jay C Chang
Assistant Examiner — Mikka Liu
(74) Attorney, Agent, or Firm — Haynes Beffel & Wolfeld LLP

(57) ABSTRACT

Roughly described, a computer program product describes a transistor with a fin, a fin support, a gate, and a gate dielectric. The fin includes a first crystalline semiconductor material which includes a channel region of the transistor between a source region of the first transistor and a drain region of the transistor. The fin is on a fin support. The fin support includes a second crystalline semiconductor material different from the first crystalline semiconductor material. The first crystalline semiconductor material of the fin and the second crystalline semiconductor material of the fin support form a first heterojunction in between. A gate, gate dielectric, and/or isolation dielectric can be positioned to improve control within the channel.

25 Claims, 19 Drawing Sheets

Related U.S. Application Data continuation of application No. PCT/US2014/044259, filed on Jun. 26, 2014.

(60) Provisional application No. 61/839,534, filed on Jun. 26, 2013.

(51) Int. Cl.
  *H01L 29/10* (2006.01)
  *H01L 27/02* (2006.01)
  *H01L 27/092* (2006.01)

(52) U.S. Cl.
  CPC .... *H01L 29/1054* (2013.01); *H01L 29/66795* (2013.01); *H01L 29/785* (2013.01)

(56) References Cited

U.S. PATENT DOCUMENTS

| | | |
|---|---|---|
| 2008/0121948 A1 | 5/2008 | Kim et al. |
| 2010/0187575 A1 | 7/2010 | Baumgartner et al. |
| 2012/0171832 A1 | 7/2012 | Toh et al. |
| 2013/0102119 A1* | 4/2013 | Cheng ............... H01L 29/66477 438/283 |
| 2013/0134481 A1 | 5/2013 | Bhuwalka et al. |
| 2013/0239077 A1 | 9/2013 | Wang et al. |
| 2014/0252487 A1 | 9/2014 | Stephens et al. |
| 2014/0264488 A1* | 9/2014 | Fronheiser ............ H01L 29/785 257/288 |

OTHER PUBLICATIONS

PCT/US2014/44259—International Preliminary Report on Patentability dated Dec. 29, 2016, 8 pages.
U.S. Appl. No. 14/925,777—Office Action dated Apr. 8, 2016, 53 pages.
U.S. Appl. No. 14/925,777—Final Office Action dated Sep. 9, 2016, 29 pages.
U.S. Appl. No. 14/925,777—Advisory Action dated Dec. 6, 2016, 3 pages.
U.S. Appl. No. 14/925,777—Office Action dated Mar. 1, 2017, 32 pages.
CN 201480024529-5—First Office Action dated Mar. 23, 2017, 29 pages.
CN 201480024529-5—Response to first Office Action dated Mar. 23, 2017 filed Aug. 7, 2017, 17 pages.
U.S. Appl. No. 14/925,777—Final Office Action dated Nov. 2, 2017, 29 pages.
CN 201480024529-5—Second Office Action dated Nov. 1, 2017, 8 pages.
CN 201480024529-5—Response to Second Office Action dated Nov. 1, 2017 as filed on Jan. 16, 2018, 16 pages.
CN 201480024529-5—Notice of Allowance dated May 21, 2018, 2 pages.
U.S. Appl. No. 14/925,777—Response to Office Action dated Apr. 8, 2015 filed Jun. 13, 2018, 22 pages.
U.S. Appl. No. 14/925,777—Response to Final Office Action dated Sep. 9, 2016 filed Oct. 7, 2016, 16 pages.
U.S. Appl. No. 14/925,777—Response to Office Action dated Mar. 1, 2017 filed, 12 pages.
U.S. Appl. No. 14/925,777—Response to Final Office Action dated Nov. 2, 2017 filed Mar. 2, 2018, 14 pages.
U.S. Appl. No. 14/925,777—Notice of Allowance dated Jun. 21, 2018, 12 pages.
DE—11 2014 003 027.9—First Office Action dated Nov. 8, 2018, 18 pages.
Hisamoto et al., "A Folded-channel MOSFET for Deep-sub-tenth Micren Era", International Electron Device Meeting, IEDM, 1998, p. 1032.
Lindert, et al., Sub-60-nm Quasi-Planar FinFETs Fabricated Using a Simplified Process, IEEE Electron Device Letters, vol. 22, No. 10, Oct. 2001, p. 487.

\* cited by examiner

FINFET WITH HETEROJUNCTION AND IMPROVED CHANNEL CONTROL

CROSS REFERENCE TO OTHER APPLICATIONS

This application is a Continuation of U.S. application Ser. No. 14/925,777, filed 28 Oct. 2015 (now U.S. Pat. No. 10,121,896), entitled "FINFET WITH HETEROJUNCTION AND IMPROVED CHANNEL CONTROL," by Victor Moroz, Stephen L. Smith and Qiang Lu, which is a Continuation of PCT International Application No. PCT/US14/44259, filed 26 Jun. 2014, entitled "FINFET WITH HETEROJUNCTION AND IMPROVED CHANNEL CONTROL," by Victor Moroz, Stephen L. Smith and Qiang Lu, which application claims the benefit of U.S. Provisional Application No. 61/839,534, filed 26 Jun. 2013, entitled "FINFET WITH CHANNEL/SRB HETEROJUNCTION AND RECESSED STI," by Victor Moroz, Stephen L. Smith and Qiang Lu, all of which are incorporated by reference herein in their entirety.

FIELD OF THE INVENTION

The invention relates to semiconductor fabrication, and more particularly to a technique for improved gate control of FinFETs with crystalline fins and crystalline fin supports.

BACKGROUND

As integrated circuit technologies continue to push into higher densities, a number of transistor types have become popular which involve one or more narrow channel structures wrapped with a gate electrode. The channel structures are often called fins, and transistors that include them are sometimes called FinFETs, described for example in D. Hisamoto et al., IEDM, 1998; and N. Lindert et al., IEEE Electron Device Letters, p. 487, 2001, both incorporated by reference herein for their teachings. The fins comprise semiconductor bodies usually arranged in parallel on the substrate, so that they project vertically upwards from the substrate. A gate dielectric layer overlies the sides and top of the fins, and a gate conductor, which can be implemented using metal or polysilicon for example, extends across the fins and over the gate dielectric layer. On either side of the gate conductor, source and drain regions are implemented in the fins. The FET transistors that result have source, channel and drain regions in the fins, and a gate overlying the fins. Such transistors are often called multi-gate transistors, because the gate conductor wraps around three sides of the fins, and as a result increases the effective width of the channel.

FinFET transistors are commonly made from a silicon fin on a silicon oxide support, or a silicon fin on a silicon support. In the case of a silicon fin on a silicon oxide support, the crystalline silicon fin is on an amorphous silicon oxide support. The amorphous silicon oxide does not influence the crystalline lattice properties of the crystalline silicon fin. In the case of a silicon fin on a silicon support, both the fin and the silicon fin are made of the same crystalline silicon with the same bandgap, same lattice constant, etc. So FinFET transistors have not been made from different crystalline materials in the fin and fin support. Such different crystalline materials require that the lattice constant and bandgap of both crystalline materials be compatible. Moreover, the feasibility of CMOS-like logic with such different crystalline materials requires that the lattice constant and bandgap of both crystalline materials be compatible for both n-type and p-type devices. Such issues discourage FinFET transistors made from different crystalline materials in the fin and fin support.

The fins used to implement the FinFET transistors can be quite narrow. As a result of the multi-gate gate structure and the narrow widths of the fins, FinFET transistors have excellent performance characteristics and small layout areas. But even with such narrow fins, the electric field generated by the gate control voltage can be limited in depth and may not extend sufficiently into the cross-sectional middle of the fin. In the off-state, this causes leakage through the middle of the fin. In the on-state, this causes lowered current through the middle of the fin. The wider the fin, the worse the decreased gate voltage control in the middle of the fin, as the middle of the fin becomes more distant from the gate. Manufacturers can reduce this problem by narrowing the fin further, but this solution is difficult to implement because the mechanical instability and line edge roughness of such a narrow fin can cause yield loss.

Fringing electric fields generated from the gate near a crystalline fin support are not expected to solve the issue of decreased gate voltage control in the middle of the fin. Conductors terminate electric field lines, and insulators support electric fields. Because a crystalline fin support is not an insulator, the crystalline fin support is expected to terminate the electric field lines from such fringing electric fields.

Accordingly, there is a need for better ways to improve FinFET transistors with different crystalline materials in the fin and fin support. Also, there is a need for better ways to improve gate control voltage in FinFET transistors.

SUMMARY

An opportunity therefore arises to create robust solutions to the problem of reduced gate control voltage in FinFET transistors with different crystalline materials in the fin and fin support. Better chip yields, and denser, and more powerful circuits, components and systems may result.

A first aspect of the technology includes a computer program product, comprising a non-transitory memory device having stored thereon a machine readable specification of a physical implementation of a circuit, the circuit including a first transistor. Examples of a machine readable specification include a cell of a cell library, a tapeout, and intermediate design specifications in between the cell library stage and the tapeout stage.

In one embodiment, the first transistor includes a first fin, a first fin support, a first gate, and a first gate dielectric.

The first fin includes a first crystalline semiconductor material. The first crystalline semiconductor material includes a first channel region of the first transistor between a source region of the first transistor and a drain region of the first transistor. The first fin is on a first fin support.

The first fin support includes a second crystalline semiconductor material different from the first crystalline semiconductor material. The first crystalline semiconductor material of the first fin and the second crystalline semiconductor material of the first fin support form a first heterojunction in between.

The first gate dielectric has an outer surface connected to the first gate, and an inner surface. The inner surface includes (i) a first part connected to the first fin adjacent to the first heterojunction and (ii) a second part connected to the first fin support adjacent to the first heterojunction.

In one embodiment, the first part of the first gate dielectric has an interior surface fitting an exterior surface of the first fin adjacent to the first heterojunction, and the second part of the first gate dielectric has an interior surface fitting an exterior surface of the first fin support adjacent to the first heterojunction.

In one embodiment, the first crystalline semiconductor material has a first bandgap, and the second crystalline semiconductor material has a second bandgap wider than the first bandgap.

In one embodiment, the circuit includes a second transistor including a second fin, a second fin support, a second gate dielectric, and a second gate.

The second fin includes a third crystalline semiconductor material different from the first crystalline semiconductor material. The third crystalline semiconductor material may be the same as, or different from, the second crystalline semiconductor material. The third crystalline semiconductor material includes a second channel region of the second transistor between a source region of the second transistor and a drain region of the second transistor. The second fin is on a second fin support.

The second fin support includes the second crystalline semiconductor material. The third crystalline semiconductor material of the second fin and the second crystalline semiconductor material of the second fin support form a second heterojunction in between.

The second gate dielectric includes: (i) a first part connected to the second fin adjacent to the second heterojunction and (ii) a second part connected to the second fin support adjacent to the second heterojunction.

The second gate of the second transistor is connected to the first part of the second gate dielectric and connected to the second part of the second gate dielectric.

The first transistor is an n-type transistor and the second transistor is a p-type transistor.

In one embodiment, the third crystalline semiconductor material has a third bandgap, and the second bandgap of the second crystalline semiconductor material is wider than the third bandgap.

In one embodiment, the first channel of the first transistor has tensile stress, and the second channel of the second transistor has compressive stress.

In one embodiment, a first current density magnitude in the first fin is higher than a second current density in the first fin support, in an on state of the first transistor and an off state of the first transistor.

In one embodiment, the first fin includes a position of minimum first current density magnitude in an on state of the first transistor, the position adjacent to an exterior of the first fin but not along the first heterojunction.

A second aspect of the technology includes a computer program product, comprising a non-transitory memory device having stored thereon a machine readable specification of a physical implementation of a circuit, the circuit including a first transistor. Examples of a machine readable specification include a cell of a cell library, a tapeout, and intermediate design specifications in between the cell library stage and the tapeout stage.

In one embodiment, the first transistor includes a first fin, a first fin support, and an isolation oxide.

The first fin includes a first crystalline semiconductor material. The first crystalline semiconductor material includes a first channel region of the first transistor between a source region of the first transistor and a drain region of the first transistor. The first fin is on a first fin support.

The first fin support includes a second crystalline semiconductor material different from the first crystalline semiconductor material. The first crystalline semiconductor material of the first fin and the second crystalline semiconductor material of the first fin support form a first heterojunction in between.

The first isolation oxide runs along opposite sides of the first fin support and electrically isolating the first fin support from adjacent fin supports. The isolation oxide is positioned only below the first heterojunction.

In one embodiment the first transistor further comprises a first gate dielectric having an inner surface including: (i) a first part connected to the first fin adjacent to the first heterojunction, (ii) a second part connected to the first fin support adjacent to the first heterojunction, and (iii) a third part connected to the first isolation oxide positioned only below the first heterojunction.

In one embodiment the first transistor further comprises a first gate having an inner surface including: (i) a first part connected to the first part of the first gate dielectric, (ii) a second part connected to the second part of the first gate dielectric.

In one embodiment the first crystalline semiconductor material has a first bandgap, and the second crystalline semiconductor material has a second bandgap wider than the first bandgap.

In one embodiment the circuit includes a second transistor including a second fin, a second fin support, and second isolation oxide.

The second fin includes a third crystalline semiconductor material different from the first crystalline semiconductor material. The third crystalline semiconductor material may be the same as, or different from, the second crystalline semiconductor material. The third crystalline semiconductor material includes a second channel region of the second transistor between a source region of the second transistor and a drain region of the second transistor. The second fin is on a second fin support.

The second fin support includes the second crystalline semiconductor material. The third crystalline semiconductor material of the second fin and the second crystalline semiconductor material of the second fin support form a second heterojunction in between.

The second isolation oxide runs along opposite sides of the second fin support and electrically isolating the second fin support from adjacent fin supports. The isolation oxide is positioned only below the second heterojunction.

The first transistor is an n-type transistor and the second transistor is a p-type transistor.

In one embodiment the third crystalline semiconductor material has a third bandgap, and the second bandgap of the second crystalline semiconductor material is wider than the third bandgap.

In one embodiment, the first channel of the first transistor has tensile stress, and the second channel of the second transistor has compressive stress.

In one embodiment, a first current density magnitude in the first fin is higher than a second current density in the first fin support, in an on state of the first transistor and an off state of the first transistor.

In one embodiment, the first fin includes a position of minimum first current density magnitude in an on state of the first transistor, the position adjacent to an exterior of the first fin but not along the first heterojunction.

A third aspect of the technology includes a computer program product, comprising a non-transitory memory device having stored thereon a machine readable specification of a physical implementation of a circuit, the circuit including a first transistor. Examples of a machine readable specification include a cell of a cell library, a tapeout, and intermediate design specifications in between the cell library stage and the tapeout stage.

In one embodiment, the first transistor includes a first fin, a first fin support, and a first gate.

The first fin includes a first crystalline semiconductor material. The first crystalline semiconductor material includes a first channel region of the first transistor between a source region of the first transistor and a drain region of the first transistor. The first fin is on a first fin support.

The first fin support includes a second crystalline semiconductor material different from the first crystalline semiconductor material. The first crystalline semiconductor material of the first fin and the second crystalline semiconductor material of the first fin support form a first heterojunction in between.

The first gate of the first transistor has an interior surface including (i) a first region spaced apart from an external surface of the first fin by about a first distance, and (ii) a second region spaced apart from part of the first fin support by about the first distance. About means +/−1 nm.

In one embodiment, the first transistor further comprises a first gate dielectric positioned (i) in between the first region of the first gate and the first fin, and (ii) in between the second region of the first gate and the first fin support. In one embodiment, the first gate dielectric, at the first region of the interior surface of the first gate and the second region of the interior surface of the first gate, has a thickness equal to about the first distance.

In one embodiment, the first crystalline semiconductor material has a first bandgap, and the second crystalline semiconductor material has a second bandgap wider than the first bandgap.

In one embodiment, the circuit includes a second transistor including a second fin, a second fin support, and a second gate.

The second fin includes a third crystalline semiconductor material different from the first crystalline semiconductor material. The third crystalline semiconductor material may be the same as, or different from, the second crystalline semiconductor material. The third crystalline semiconductor material includes a second channel region of the second transistor between a source region of the second transistor and a drain region of the second transistor. The second fin is on a second fin support.

The second fin support includes the second crystalline semiconductor material. The third crystalline semiconductor material of the second fin and the second crystalline semiconductor material of the second fin support form a second heterojunction in between.

The second gate of the second transistor has an interior surface including (i) a first region spaced apart from an external surface of the second fin by about a second distance, and (ii) a second region spaced apart from part of the second fin support by about the second distance. About means +/−1 nm.

The first transistor is an n-type transistor and the second transistor is a p-type transistor.

In one embodiment, the third crystalline semiconductor material has a third bandgap, and the second bandgap of the second crystalline semiconductor material is wider than the third bandgap.

In one embodiment, the first channel of the first transistor has tensile stress, and the second channel of the second transistor has compressive stress.

In one embodiment, a first current density magnitude in the first fin is higher than a second current density in the first fin support, in an on state of the first transistor and an off state of the first transistor.

In one embodiment, the first fin includes a position of minimum first current density magnitude in an on state of the first transistor, the position adjacent to an exterior of the first fin but not along the first heterojunction.

Further aspects of the technology are directed to the physically fabricated or partly fabricated FinFET circuits themselves.

Yet further aspects of the technology are directed to the wafer with the physically fabricated or partly fabricated FinFET circuits.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The patent or application file of the U.S. priority application contains at least one drawing executed in color. Copies of this patent or patent application publication with color drawing(s) will be provided by the U.S. Patent and Trademark Office upon request and payment of the necessary fee. The color drawings are incorporated by reference herein.

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
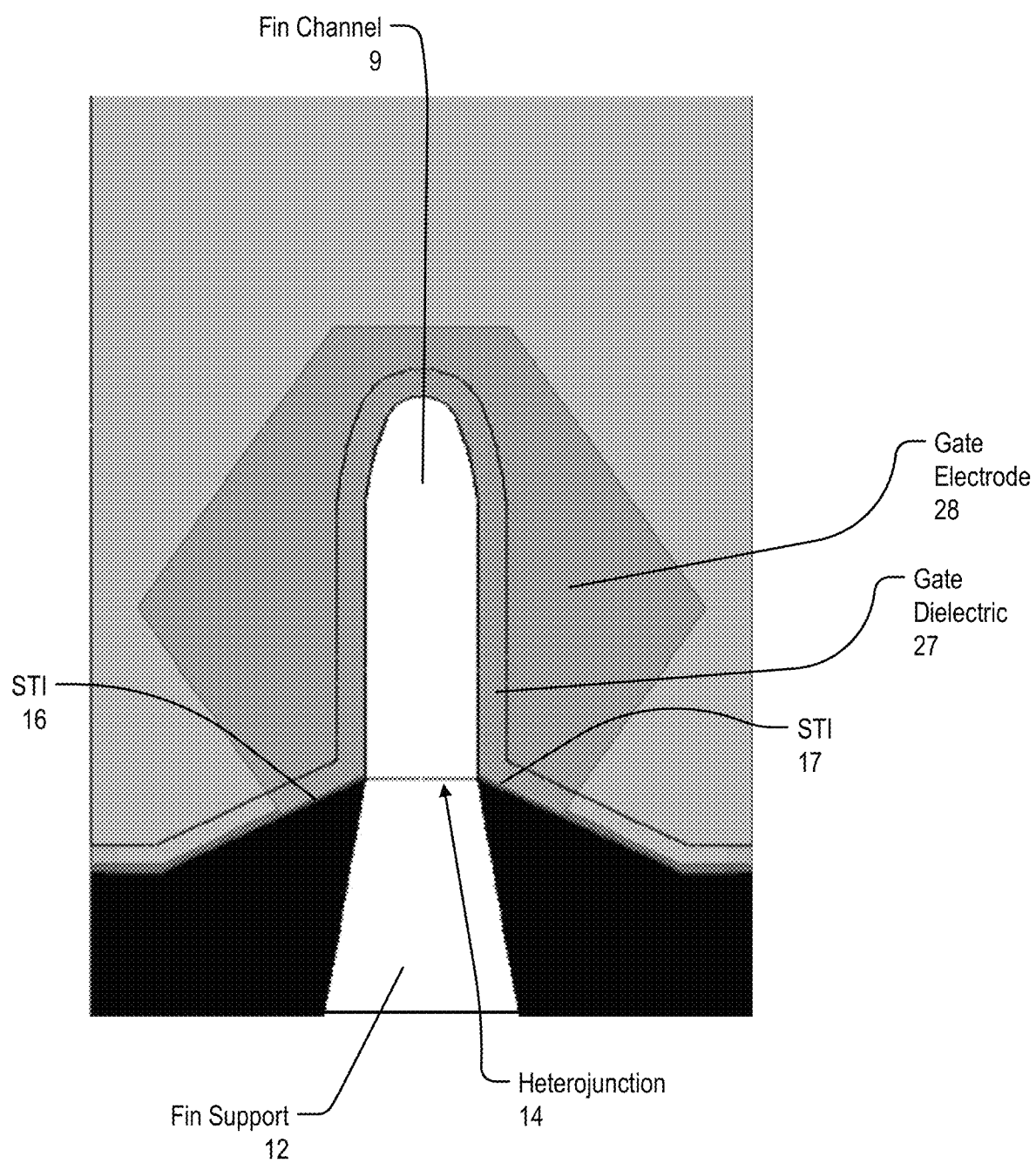
FIG. 1 illustrates a simplified FinFET transistor with a crystalline fin and a crystalline fin support.

FIG. 1 illustrates a simplified FinFET transistor with a crystalline fin and a crystalline fin support.

The figure is a cross-section of the channel portion of a FinFET, with current going in a direction in a Z-direction perpendicular to the page. The portion of the fin 9 shown is the channel region, with source and drain regions of the fin in front of and behind the channel region in the Z-direction. The fin 9 and the fin support 12 are formed of different crystalline semiconductor materials. A heterojunction 14 is formed at the interface in between the different crystalline semiconductor materials of the fin 9 and the fin support 12. Because of the different crystalline semiconductor materials in the fin 9 and the fin support 12 with different lattice constants, some embodiments utilize stress engineering to adjust the device properties in fin 9.

In various embodiments, there is no dielectric in between the fin 9 and the fin support 12, to confine electrons and holes in the fin 9. In such embodiments, the bandgaps of the different crystalline semiconductor materials in the fin 9 and the fin support 12 are chosen such that the bandgap of the crystalline semiconductor material in the fin support 12 is wider than the bandgap of the crystalline semiconductor material in the fin 9. In the region of the heterojunction 14, the conduction band edge changes between fin 9 and the fin support 12, such that electrons at the conduction band edge in the fin support 12 have relatively higher electron energy, and electrons at the conduction band edge in the fin 9 have relatively lower electron energy. Also in the region of the heterojunction 14, the valence band edge changes between fin 9 and the fin support 12, such that holes at the valence band edge in the fin support 12 have relatively higher hole energy, and holes at the valence band edge in the fin 9 have relatively lower hole energy. Accordingly, the band structures of the different crystalline semiconductor materials in the fin 9 and the fin support 12 help confine electrons and holes in the fin 9, even without a dielectric between the fin 9 and the fin support 12.

Isolation dielectric, which can be shallow trench isolation silicon oxide 16 and 17, electrically isolate the fin support 12 from adjacent fin supports on either side of the shown fin support 12. The upper surface of the shallow trench isolation oxide 16 and 17 begins on either side of the fin support 12 at the heterojunction 14, and slopes downward with distance from the heterojunction 14.

A gate dielectric 27 conformally covers the fin 9 and the shallow trench isolation silicon oxide 16 and 17. The gate dielectric 27 can be a dielectric which electrically separates the gate from the fin 9 and supports the electric field from the gate to the fin 9. In one embodiment, the gate dielectric 27 is a multilayer structure, including multiple monolayers of silicon oxide, such as 2 or 3 monolayers 0.6 nm to 0.9 nm thick, and a layer of hafnium oxide about 1 nm thick. The physical thicknesses cannot be too thin due to gate leakage requirements, and cannot be too thick due to transistor performance requirements. In some embodiments, the physical thickness is in a range of about 1.5 nm to 2 nm. The thicknesses and materials are illustrative and can be varied. Thicknesses are subject to manufacturing variability, such that "about" some distance can indicate a difference of plus or minus 1 nm.

A gate electrode 28 covers the gate dielectric 27 which conformally covers the fin 9. The gate electrode 28 can also cover part of the gate dielectric 27 which conformally covers the shallow trench isolation oxide 16 and 17.

In the shown embodiment, the fin support 12 is not covered by the gate dielectric 27. Instead, the fin support 12 is covered by the shallow trench isolation oxide 16 and 17. The bottom surface of the gate electrode 28 is determined by the upper surface of the gate dielectric 27, and the shallow trench isolation oxide 16 and 17 cause a varying distance between the fin support 12 and the upper surface of the gate dielectric 27. Accordingly, the shallow trench isolation oxide 16 and 17 cause a varying distance between the fin support 12 and the bottom surface of the gate electrode 28. This varying distance ensures that any fringing electric fields generated by the gate electrode above the shallow trench isolation oxide 16 and 17 attenuate prior to reaching, and exerting gate control over, the fin 9.

In various embodiments, the fin 9 and the fin support 12 are undoped. In other embodiments, the fin 9, the fin support 12, or both the fin 9 and the fin support 12 are doped. On the one hand, doping has traditionally adjusted the conductivity of semiconductor materials. On the other hand, undoped semiconductor materials can result in improved electron and hole mobilities, and address the random spatial fluctuations of dopant concentrations that result in randomly fluctuating device behavior.

Figure 2:
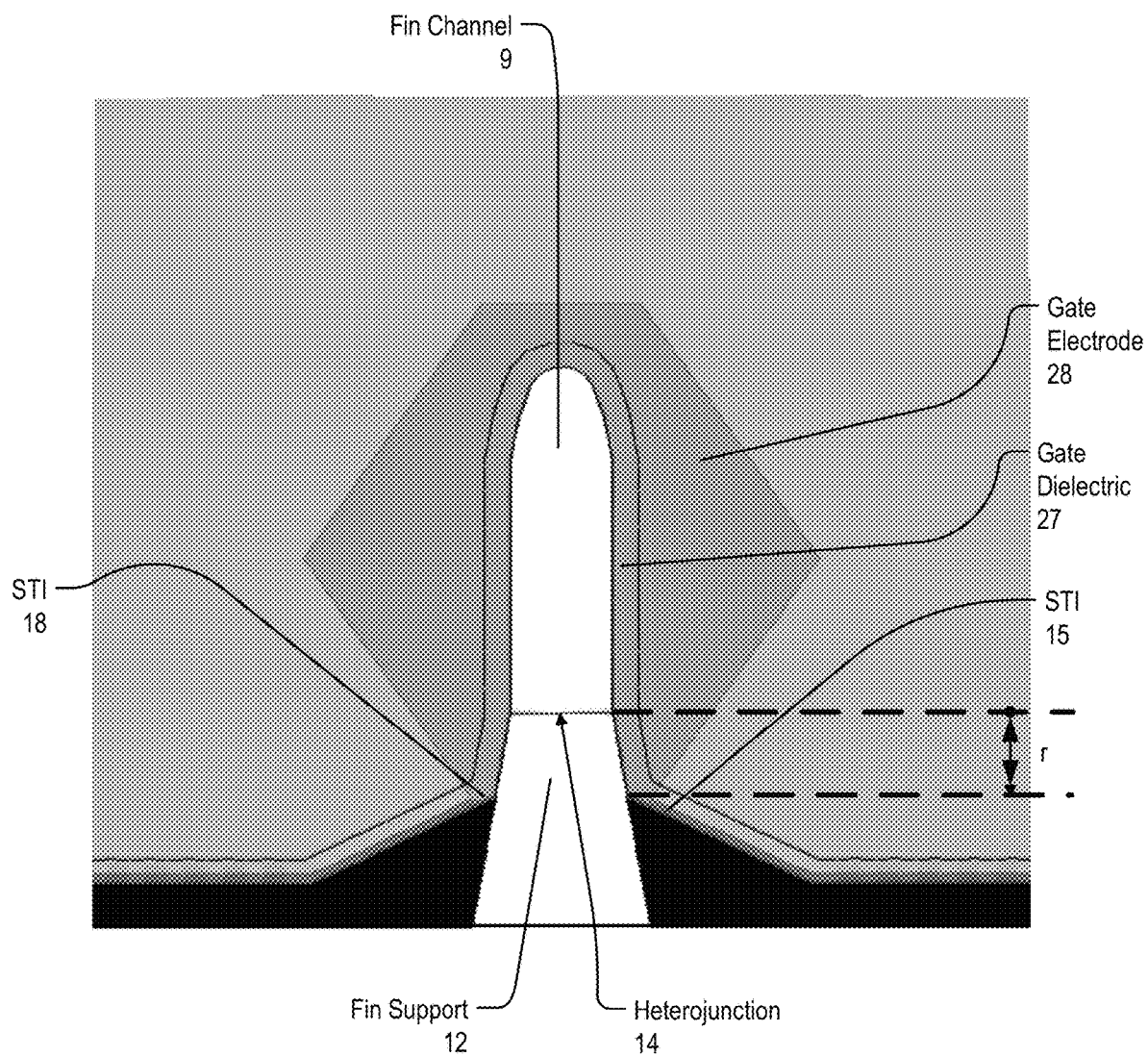
FIG. 2 illustrates a simplified FinFET transistor with a crystalline fin, a crystalline fin support, and improved gate control.

FIG. 2 illustrates a simplified FinFET transistor with a crystalline fin, a crystalline fin support, and improved gate control.

FIG. 2 is generally similar to FIG. 1, showing a cross-section of the channel portion of a FinFET, with current going in a Z-direction perpendicular to the page. As in FIG. 1, a heterojunction 14 is formed at the interface in between the different crystalline semiconductor materials of the fin 9 and the fin support 12. In various embodiments of FIG. 2, there is no dielectric in between the fin 9 and the fin support 12, to confine electrons and holes in the fin 9. Isolation dielectric, which can be shallow trench isolation silicon oxide 15 and 18, electrically isolate the fin support 12 from adjacent fin supports on either side of the shown fin support 12.

However, in FIG. 2, the upper surface of the shallow trench isolation oxide 15 and 18 begins on either side of the fin support 12 below the heterojunction 14 and slopes downward with distance from the heterojunction 14. Relative to the heterojunction 14, the shallow trench isolation oxide 15 and 18 is recessed by a distance "r". In some embodiments, "r" is in the range from 1-20 nm, and more preferably 1-10 nm. In some embodiments the shallow trench isolation oxide 15 and 18 is positioned only below the heterojunction 14.

A gate dielectric 27 conformally covers not only the fin 9 and the shallow trench isolation silicon oxide 15 and 18, but also part of the fin support 12 below the heterojunction 14. Accordingly, the gate dielectric 27 includes a part above the heterojunction 14 connected to the fin 9, a part below the heterojunction 14 connected to the fin support 12 for the distance "r", and a part connected to the shallow trench isolation oxide 15 and 18 positioned only below the heterojunction 14. Above the heterojunction 14, the gate dielectric 27 has an interior surface fitting an exterior surface of the fin 9. Below the heterojunction 14, the gate dielectric 27 has an interior surface fitting an exterior surface of the fin support 12.

As in FIG. 1 a gate electrode 28 covers the gate dielectric 27 which conformally covers the fin 9, and can also cover part of the gate dielectric 27 which conformally covers the shallow trench isolation oxide 16 and 17. In addition, the gate electrode 28 covers the gate dielectric 27 which conformally covers part of the fin support 12 below the heterojunction 14 by the distance "r".

Figure 3:
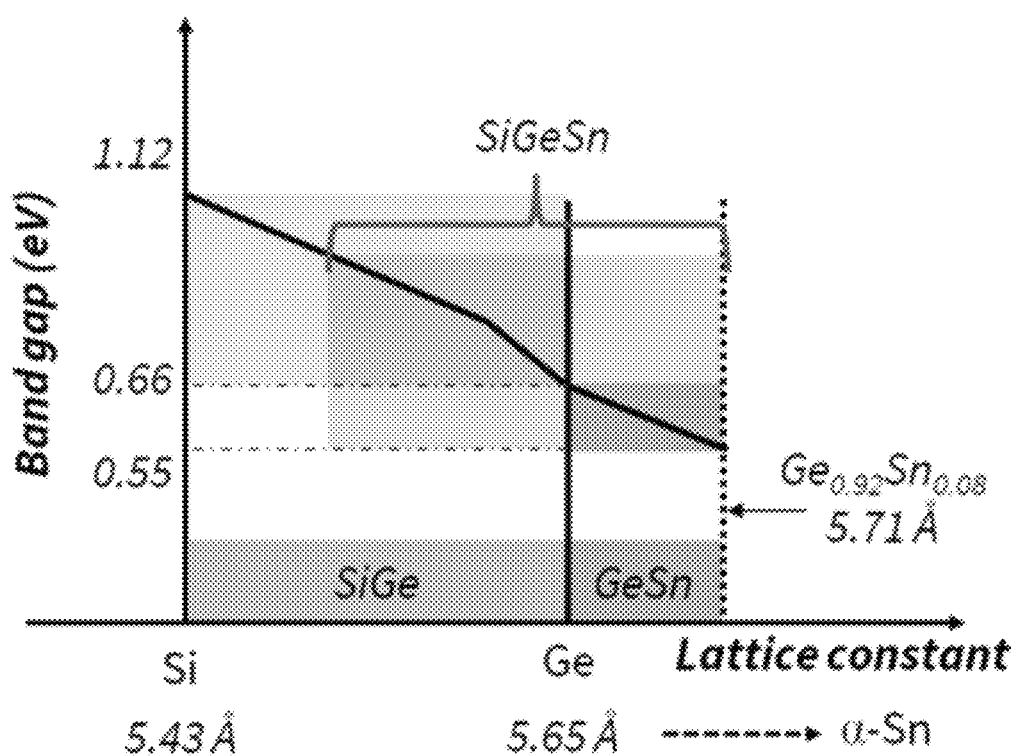
FIG. 3 shows an example of tuning elemental ratios to optimize the bandgap and lattice constant.

FIG. 3 shows an example of tuning elemental ratios to optimize the bandgap and lattice constant. Sn-based alloys are used as different crystalline semiconductors in the fin and fin support. In one example, GeSn and SiGeSn expand the design space for band gap and stress engineering in a Si-compatible platform. A common buffer layer in the fin support for n and p channel devices alleviates difficulties in integration of different channel materials for n and p channel devices. In FIG. 3, the Si/Sn ratio in SiGeSn is tuned, and bandgap and lattice constant are decoupled. In one example, the common buffer layer of SiGeSn with 32% Si and 8% Sn is lattice-matched to Ge and has a bandgap of 0.87 eV.

Other embodiments can use other materials, according to the valence band and conduction band overlap factors discussed above, and stress engineering factors to apply tensile stress for n-type transistors and compressive stress for p-type transistors.

Figure 4:
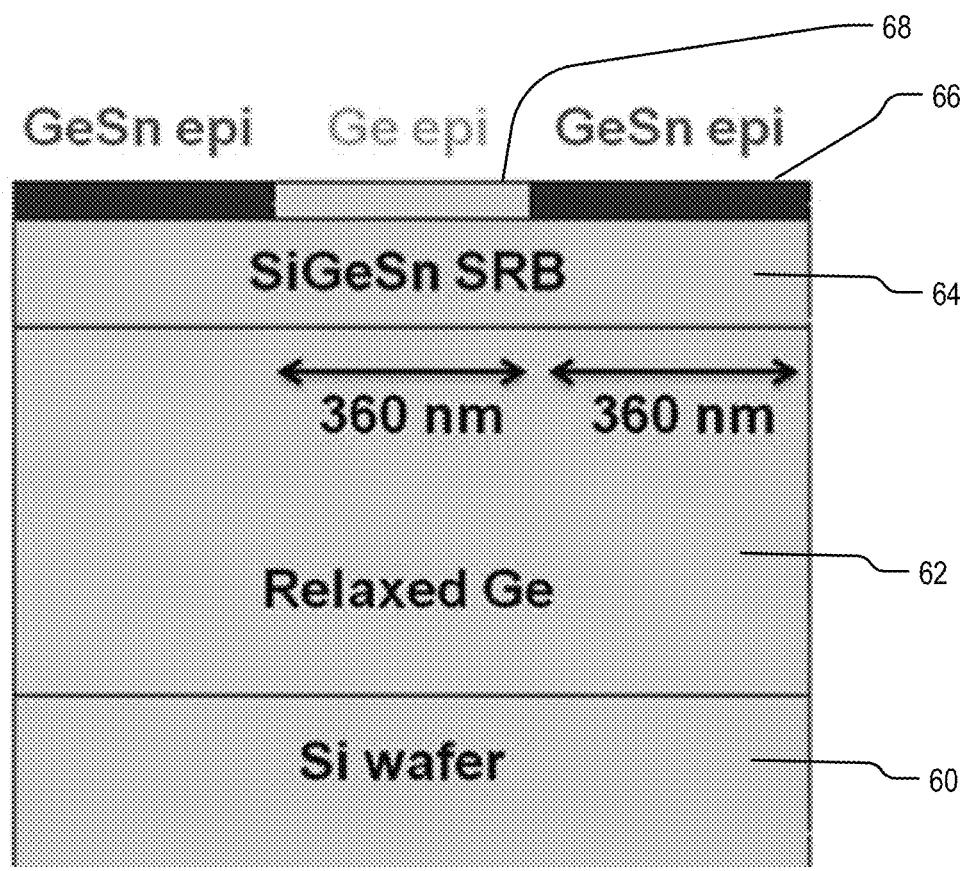
FIG. 4 shows an example wafer which supports the fabrication of FinFETs having improved gate control.

FIG. 4 shows an example wafer which supports the fabrication of FinFETs having improved gate control. A common strain-relaxed buffer (SRB) acts as material for the fin support, for both p-type and n-type transistors. SiGeSn lattice-matched to Ge 62 is used as SRB 64. As for the fin epitaxial layers, epitaxial Ge 68 is used for NMOS fins and epitaxial GeSn (4% Sn) 66 for PMOS. The layers are grown on a silicon wafer 60.

Figure 5:
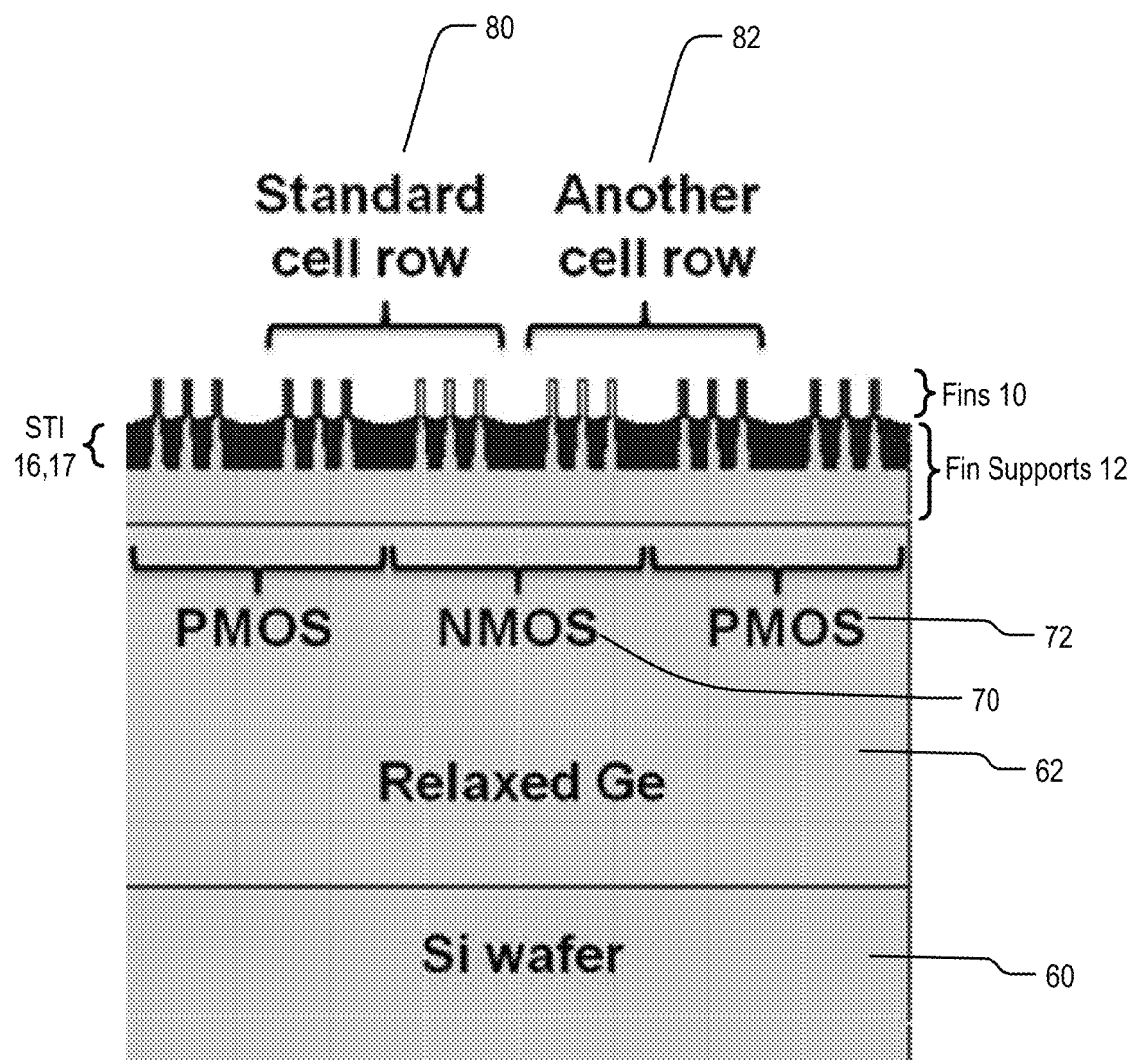
FIG. 5 shows the example wafer of FIG. 4 after patterning fins and fin supports.

FIG. 5 shows the example wafer of FIG. 4 after patterning fins and fin supports. In FIG. 5, the fins 10 are on fin supports 12. Adjacent fin supports of the fin supports 12 are electrically isolated by the shallow trench isolation oxide 16 and 17. A larger view of the resulting fins 10, fin supports 12, and shallow trench isolation oxide 16 and 17 is shown in FIG. 1. The fins 10 include NMOS fins 70 formed of epitaxial Ge and PMOS fins 72 formed of epitaxial GeSn (4% Sn). Cell row 80 includes multiple adjacent PMOS fins adjacent to multiple adjacent NMOS fins. Cell row 82 includes multiple adjacent PMOS fins adjacent to multiple adjacent NMOS fins.

The crystalline semiconductor material of the NMOS fins, the crystalline semiconductor material of the PMOS fins, and crystalline semiconductor material of the fin supports are all different from each other. The bandgap of the crystalline semiconductor material of the fin supports is larger than the bandgaps of the crystalline semiconductor material of both the NMOS fins and the PMOS fins.

In one embodiment, a wafer is fabricated with the fins and fin supports from different crystalline semiconductor materials. Such a wafer can be made by one party, and provided to another party that can complete the remaining fabrication.

Figure 6:
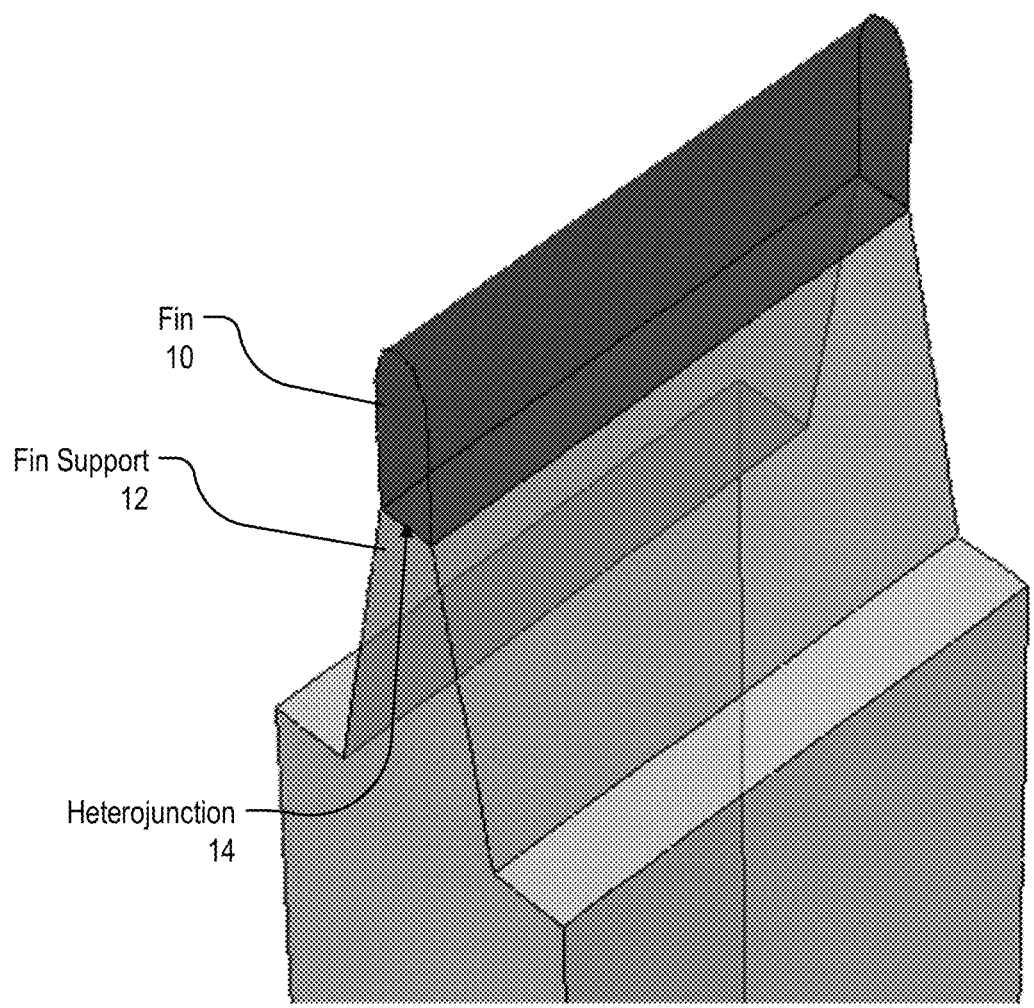
FIG. 6 shows a step in an example process flow of the fabrication of FinFETs having improved gate control, showing a fin and a fin support.

FIG. 6 shows a step in an example process flow of the fabrication of FinFETs having improved gate control, showing a fin 10 and a fin support 12 forming a heterojunction 14 in between. The fin 10 and fin support 12 can be formed by any method such as deposition of the fin support material and fin material, followed by lithographic patterning and etching. In cases where there are multiple types of fin material, such as one for p-type and one for n-type, the different types of fin material are deposited separately.

Figure 7:
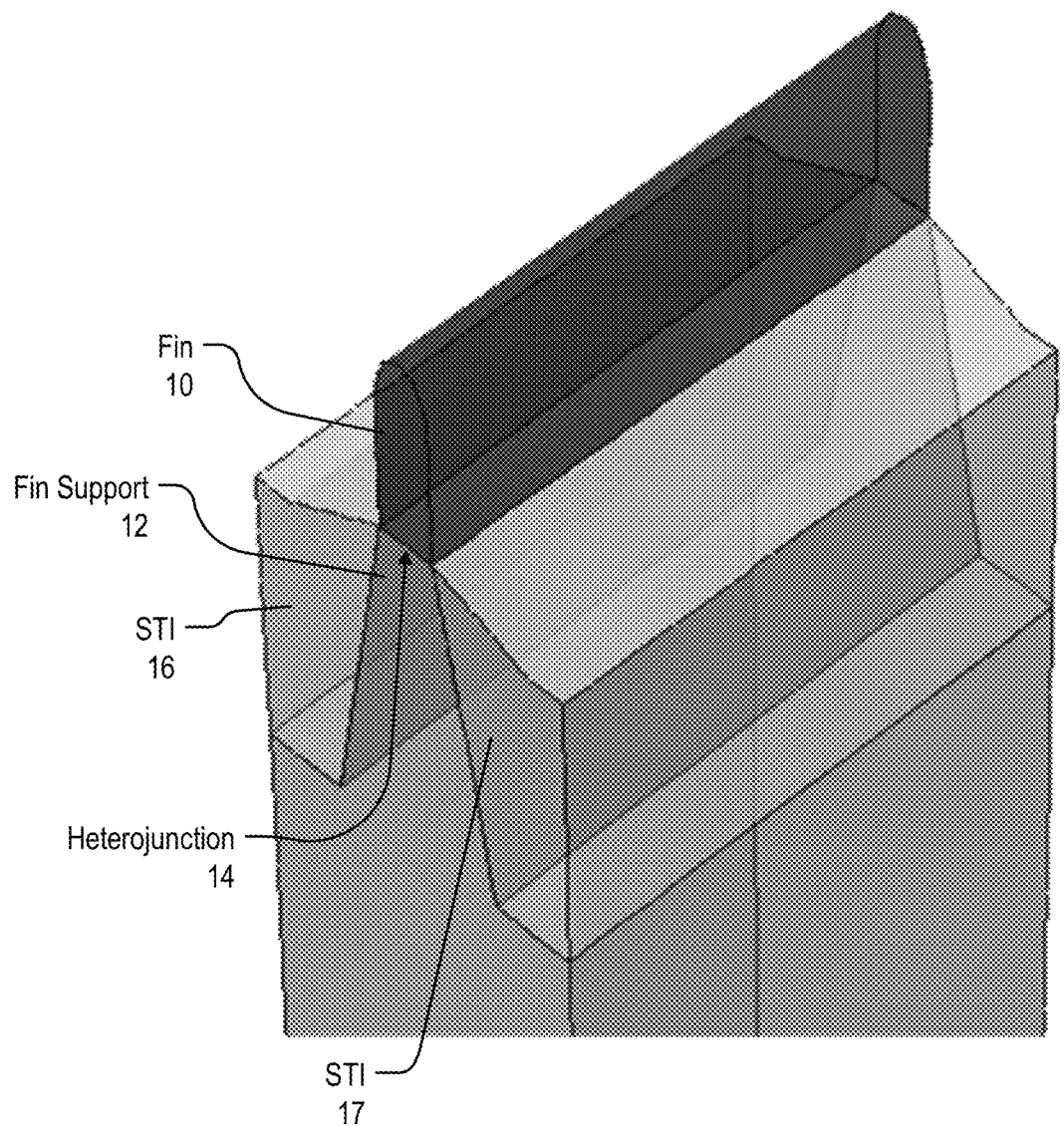
FIG. 7 shows a step in an example process flow of the fabrication of FinFETs having improved gate control, showing shallow trench isolation oxide.

FIG. 7 shows a step in an example process flow of the fabrication of FinFETs having improved gate control, showing shallow trench isolation oxide.

The shallow trench isolation silicon oxide can be formed by any method such as deposition and lithographic patterning of the fins and etching of the silicon oxide material. The amount of etching determines whether the result is the FinFET device of FIG. 1 or FIG. 2. If etching of the silicon oxide material is stopped when the upper edge of the silicon oxide material is above or about level with the heterojunction 14 as shown, the result is the FinFET device of FIG. 1. If etching of the silicon oxide material is continued further, such that the upper edge of the silicon oxide material is below the heterojunction 14, the result is the FinFET device of FIG. 2.

Figure 8:
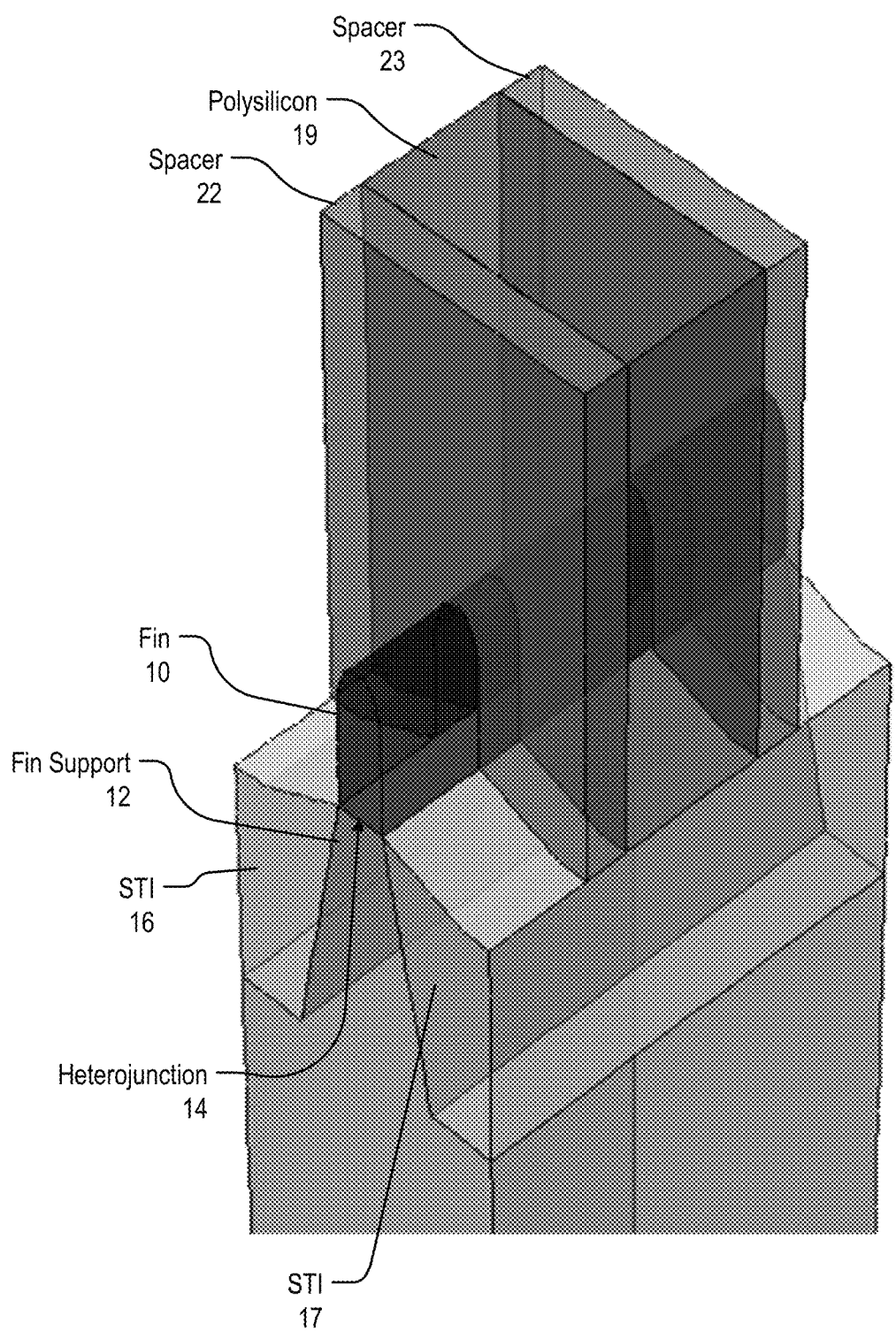
FIG. 8 shows a step in an example process flow of the fabrication of FinFETs having improved gate control, showing gate definition and spacers between the defined gate position and source/drain positions.

FIG. 8 shows a step in an example process flow of the fabrication of FinFETs having improved gate control, showing gate definition and spacers between the defined gate position and source/drain positions.

A dummy gate of material such as polysilicon 19 is formed above the channel region of the fin 10 by any method such as deposition and lithographic patterning and etching of the dummy gate material. Insulating spacers 22 and 23 are formed above the regions of the fin 10 adjacent to the channel region, by any method such as deposition and anisotropic etching of the insulating material. The spacers 22 and 23 will electrically isolate the gate above the channel region from the contacts above the source and drain regions.

Figure 9:
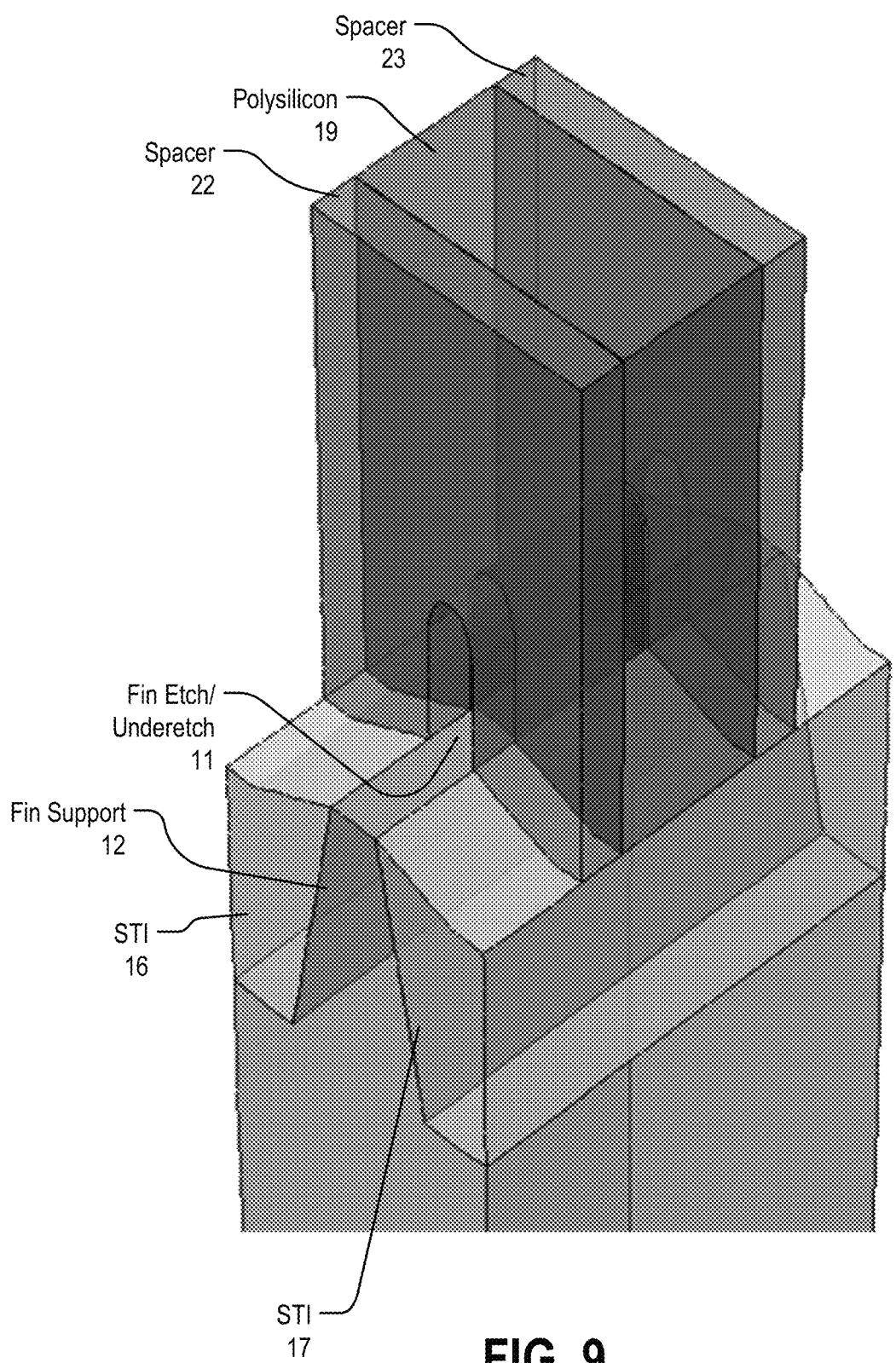
FIG. 9 shows a step in an example process flow of the fabrication of FinFETs having improved gate control, showing etching of the fin from source/drain positions.

FIG. 9 shows a step in an example process flow of the fabrication of FinFETs having improved gate control, showing etching of the fin from source/drain positions.

The fin regions adjacent to the spacers 22 and 23 are etched, and the fin regions adjacent to the spacers 22 and 23 are underetched, to make way for the regrown source and drain regions.

Figure 10:
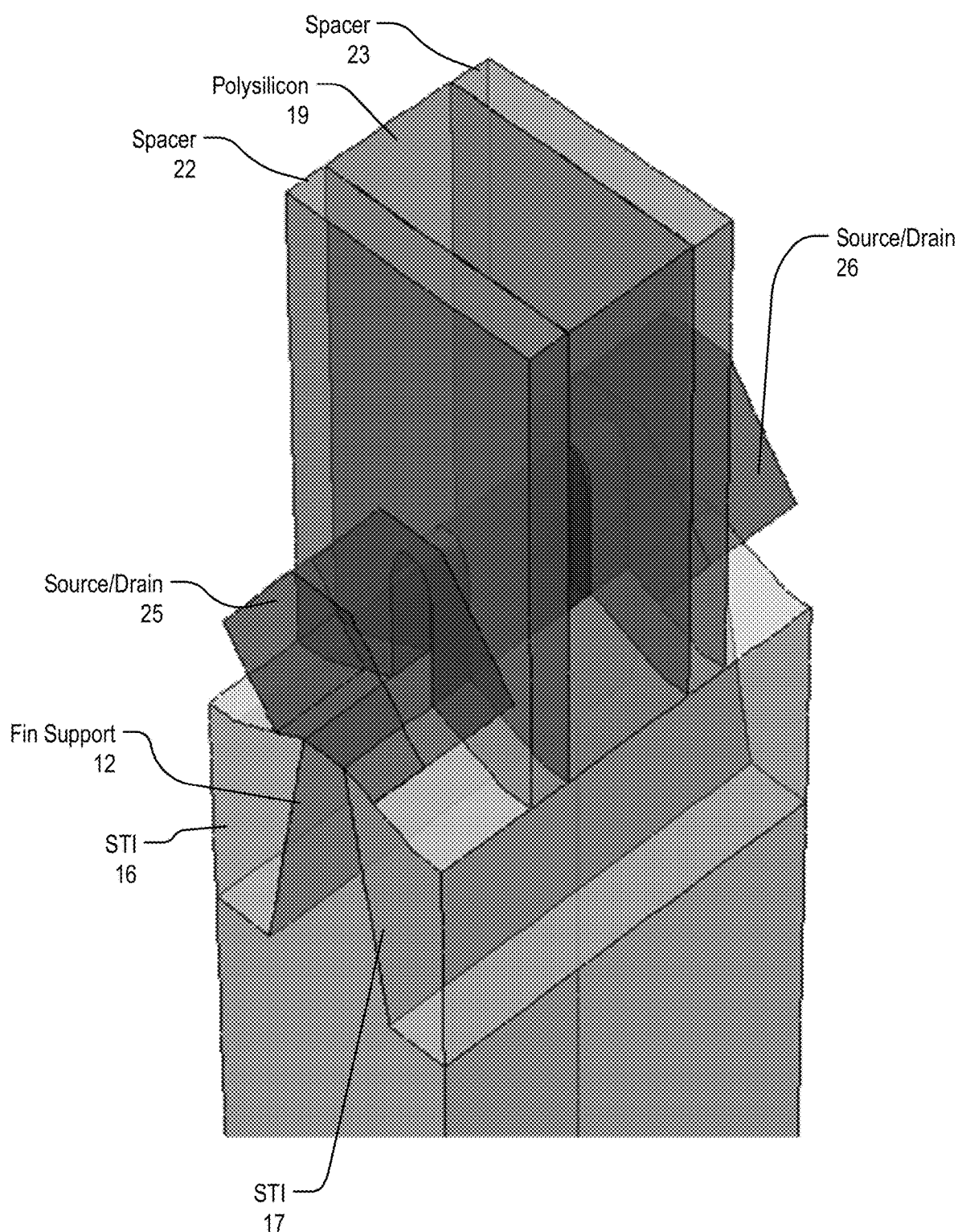
FIG. 10 shows a step in an example process flow of the fabrication of FinFETs having improved gate control, showing growth of the source and drain.

FIG. 10 shows a step in an example process flow of the fabrication of FinFETs having improved gate control, showing growth of the source and drain regions.

In some embodiments, the source and drain regions are epitaxially regrown. In some embodiments, the source and drain regions are formed from different materials. In one embodiment, the PMOS source and drain are formed of GeSn (8% Sn), and the NMOS source and drain are formed of SiGe (70% Ge).

Figure 11:
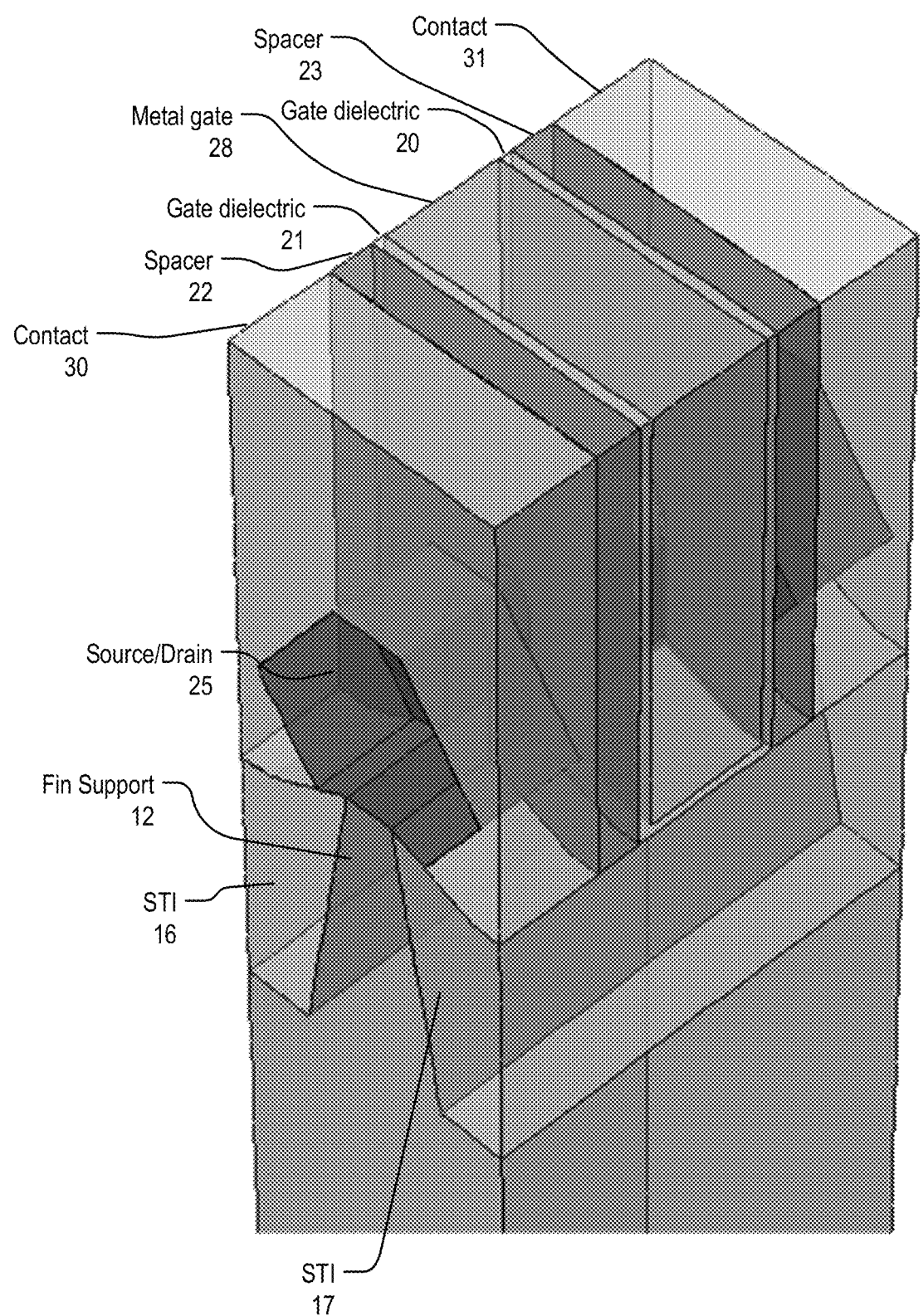
FIG. 11 shows a step in an example process flow of the fabrication of FinFETs having improved gate control, showing the gate and source/drain contacts.

FIG. 11 shows a step in an example process flow of the fabrication of FinFETs having improved gate control, showing the gate and source/drain contacts.

The interior of the dummy polysilicon gate is removed and replaced with a high-K gate dielectric 20 and 21 and metal gate 28. Source and drain contacts 30 and 31 are formed on the source/drain 25. The metal gate 28 can include conductors such as metal (e.g., TiN, TiAl, and TiAlN).

Figure 12:
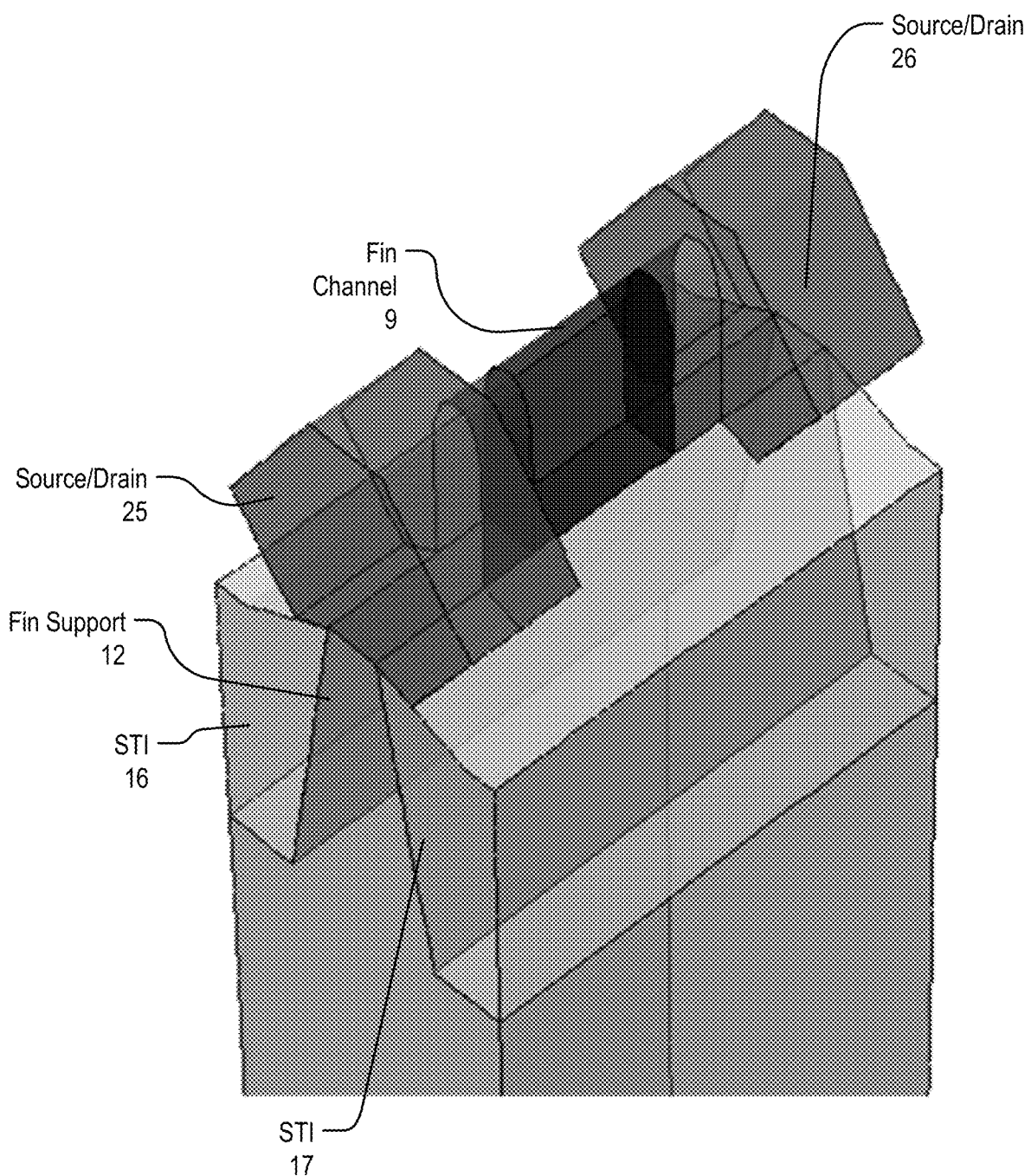
FIG. 12 shows another view of FinFETs having improved gate control in FIG. 11.

FIG. 12 shows another view of FinFETs having improved gate control in FIG. 11. In some embodiments, stress engineering is accomplished with the different crystalline semiconductor materials of the fin channel 9 and the fin support 12. In some embodiments, stress engineering in the fin channel 9 is accomplished partly or wholly with the source/drain 25 and 26. Accordingly, the selection of materials from which the different crystalline semiconductor materials of the fin channel 9 and the fin support 12 is widened with the source/drain 25 and 26. In the event that the different crystalline semiconductor materials of the fin channel 9 and the fin support 12 have appropriate band structures, but insufficient stress engineering, the source/drain 25 and 26 can be used to add desirable stress.

Figure 13:
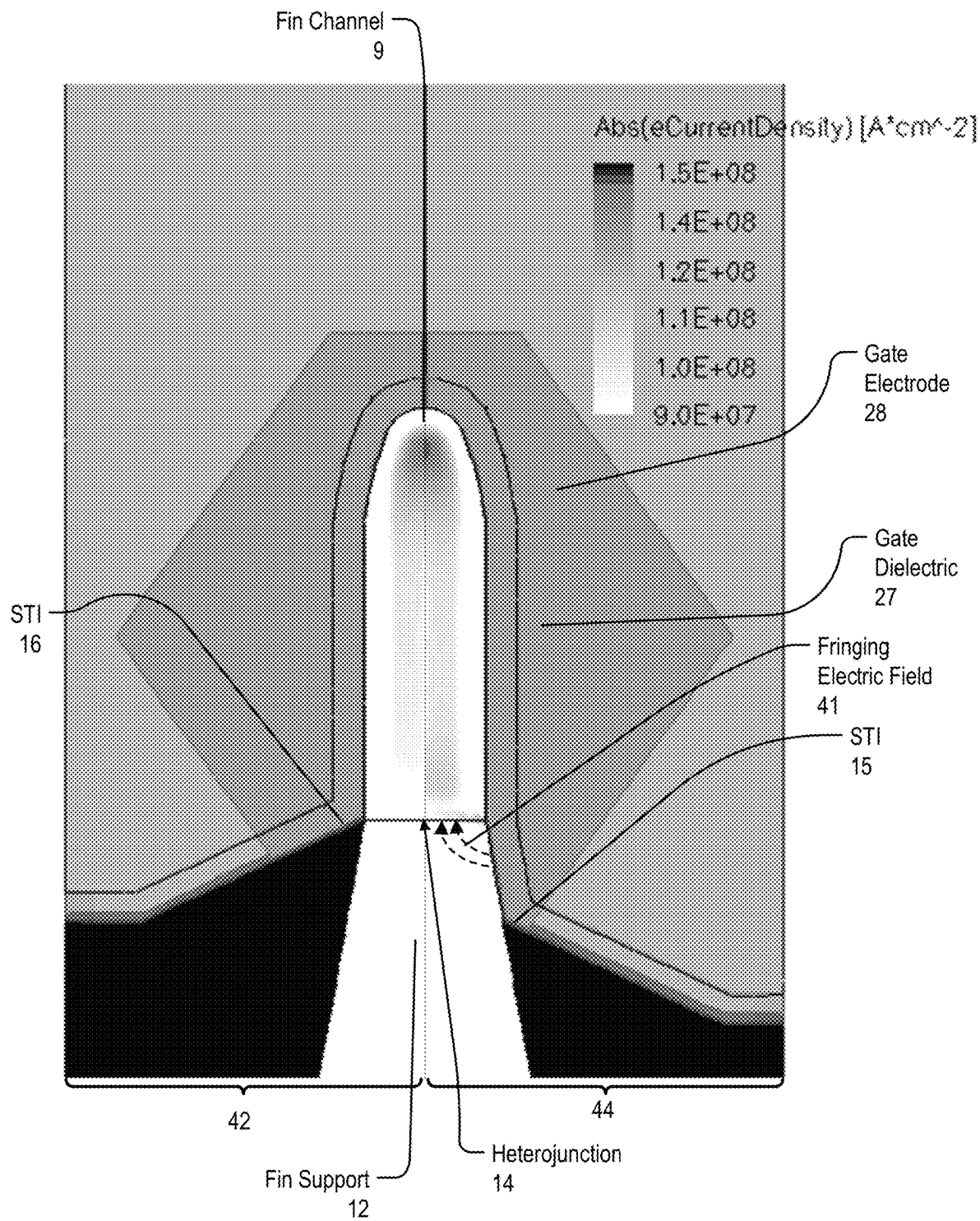
FIG. 13 is a current density graph comparing FinFETs with and without improved gate control in the on state.

FIG. 13 is a current density graph comparing NMOS FinFETs with and without improved gate control in the on state.

Figure 19:
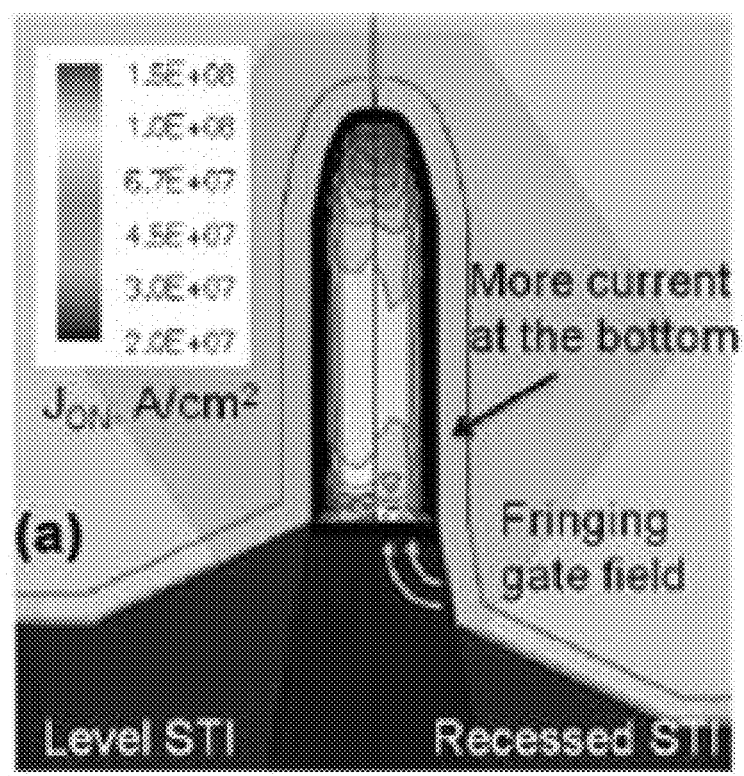
FIG. 19 shows simulation results illustrating current density in the channel for a transistor in the ON state (Ion).

FIG. 19 shows simulation results illustrating current density in the channel for a transistor in the ON state (Ion). The figure is split such that the left half shows the results for a conventional device, in which the gate extends only down to the level of the heterojunction, and the right half shows the results for the new device, in which the gate extends down by a distance "r" below the level of the heterojunction. It can be seen that in the higher regions of the channel the current density in the ON state is roughly equal for the two devices, but toward the bottom of the channel the current density is higher for the new structure (on the right) than the conventional structure (on the left).

In FIG. 13, the left part 42 corresponds to the FinFET of FIG. 1, and the right part 44 corresponds to the FinFET of FIG. 2. The left part 42 and right 44 from the different FinFETs are combined for ease of comparison.

In the left part 42, shallow trench isolation silicon oxide 16 has an upper surface beginning on the side of the fin support 12 at the heterojunction 14, and sloping downward with distance from the heterojunction 14.

In the right part 44, shallow trench isolation silicon oxide 15 has an upper surface beginning on the side of the fin support 12 below the heterojunction 14, and sloping downward with distance from the heterojunction 14. Relative to the heterojunction 14, the shallow trench isolation oxide 15 is recessed. Because of the recessed shallow trench isolation oxide 15, part of the gate electrode 28 is sufficiently close to the bottom of the fin channel 9, such that fringing electric field 41 can significantly change the current density within the fin channel. Although the crystalline semiconductor material in the fin support 12 is not an oxide, fringing electric field 41 crosses the fin support 12 without termination. In some embodiments, the fringing electric field 41 is attenuated by the fin support 12.

In particular, fringing electric field 41 raises the electron current density of the NMOS transistor within the fin channel 9 near the heterojunction 14. Within the fin channel 9, the portion closest to the fringing electric field 41 is near the heterojunction 14. So current density magnitude within the fin channel 9 rises more near the heterojunction 14 than away from the heterojunction 14. The part of the fin channel 9 near the exterior surface of the fin channel 9 is closest to the interior surface of the gate electrode 28, and is in relatively close proximity to the electric field from the interior surface of the gate electrode above the heterojunction 14. Accordingly, the current density magnitude within the fin channel 9 rises less near the exterior surface of the fin channel 9 and more away from the exterior surface of the fin channel 9.

Thus, comparing the left part 42 and right part 44 from the different FinFETs shows that improved gate voltage control results in more current through fin channel 9, in particular proximate to the heterojunction 14 and in the interior of the fin channel 9.

Figure 14:
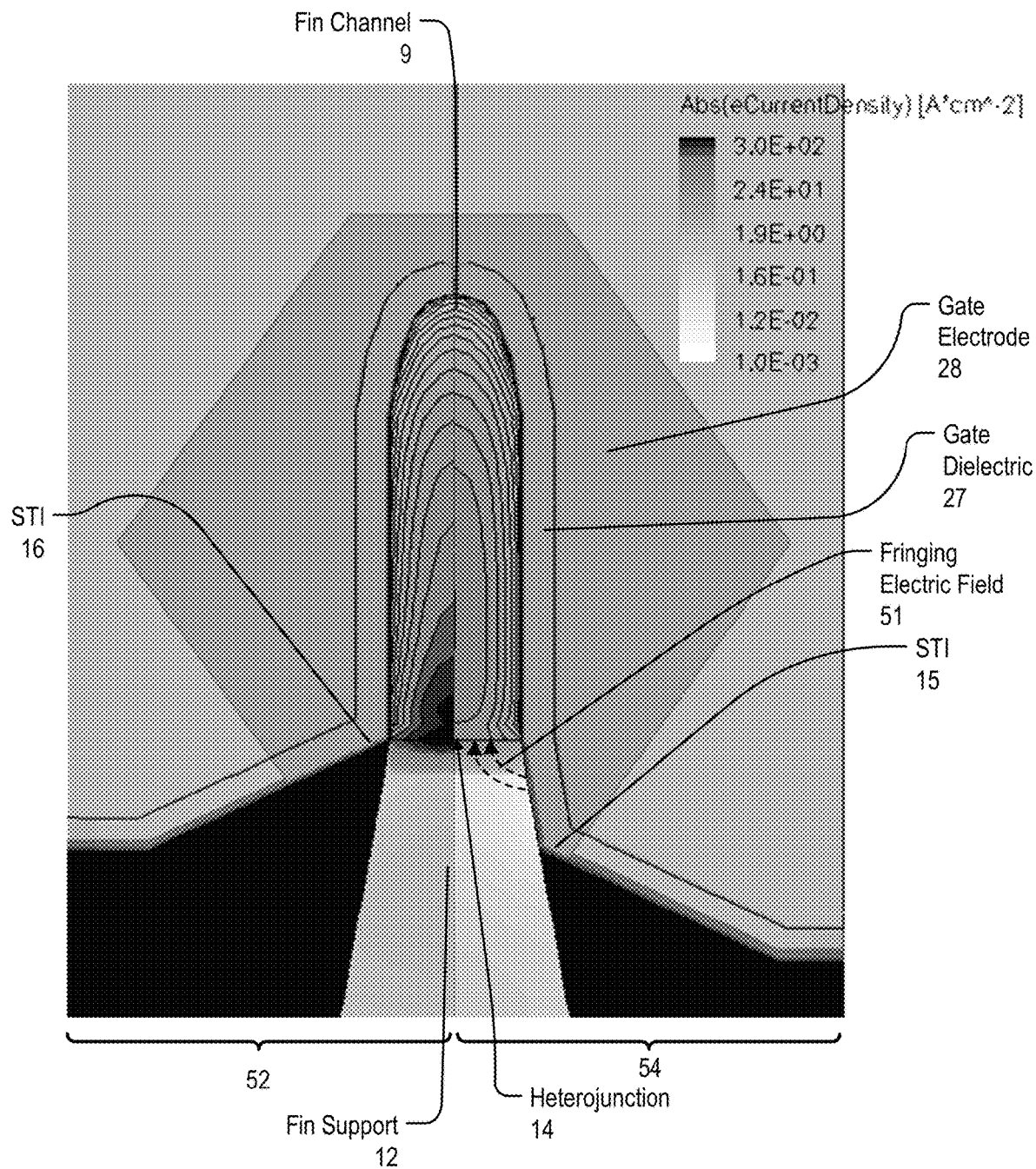
FIG. 14 is a current density graph comparing FinFETs with and without improved gate control in the off state.

FIG. 14 is a current density graph comparing NMOS FinFETs with and without improved gate control in the off state.

In FIG. 14, the left part 52 corresponds to the FinFET of FIG. 1, and the right part 54 corresponds to the FinFET of FIG. 2. The left part 52 and right 54 from the different FinFETs are combined for ease of comparison. FIG. 14 generally corresponds to FIG. 13, but shows the off state rather than the on state.

Fringing electric field 51 lowers the electron current density of the NMOS transistor within the fin channel 9 near the heterojunction 14. Within the fin channel 9, the portion closest to the fringing electric field 41 is near the heterojunction 14. So current density magnitude within the fin channel 9 falls more near the heterojunction 14 than away from the heterojunction 14. The part of the fin channel 9 near the exterior surface of the fin channel 9 is closest to the interior surface of the gate electrode 28, and is in relatively close proximity to the electric field from the interior surface of the gate electrode above the heterojunction 14. Accordingly, the current density magnitude within the fin channel 9 falls less near the exterior surface of the fin channel 9 and more away from the exterior surface of the fin channel 9.

Thus, comparing the left part 52 and right part 54 from the different FinFETs shows that improved gate voltage control results in less current through fin channel 9, in particular proximate to the heterojunction 14 and in the interior of the fin channel 9.

The peak off-state current density is at the heterojunction 14, in the fin channel 9. Below the heterojunction 14, in the fin support 12, leakage is suppressed by the wider bandgap of the crystalline semiconductor material in the fin support 12 in contrast with the crystalline semiconductor material in the fin channel 9.

Figure 15:
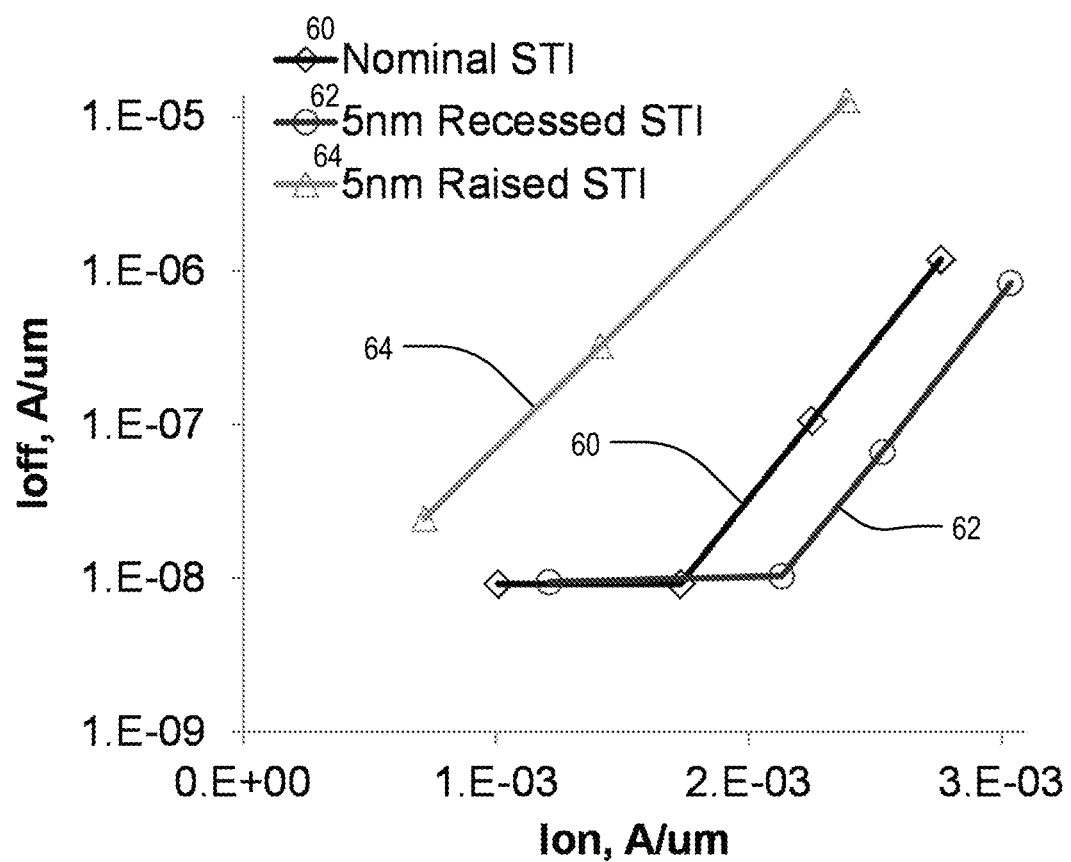
FIG. 15 is a graph comparing FinFETs with and without improved gate control in the off state.

FIG. 15 is a graph comparing NMOS FinFETs with and without improved gate control in the off state. Trace 60 corresponds to nominal STI, or shallow trench isolation silicon oxide having an upper surface beginning at the heterojunction 14. Trace 62 corresponds to recessed STI, or shallow trench isolation silicon oxide having an upper surface beginning on the side of the fin support below the heterojunction, by 5 nm. Trace 64 corresponds to raised STI, or shallow trench isolation silicon oxide having an upper surface beginning on the side of the fin above the heterojunction, by 5 nm.

The graph shows that a recessed STI improves performance, such that a FinFET with a particular off state current density has higher on state current density. Generally, the recessed STI FinFET shows a 20% improvement in on state current density.

The graph shows that a raised STI worsens performance, such that a FinFET with a particular off state current density has lower on state current density. Generally, the raised STI FinFET shows a 50% degradation in on state current density.

Figure 16:
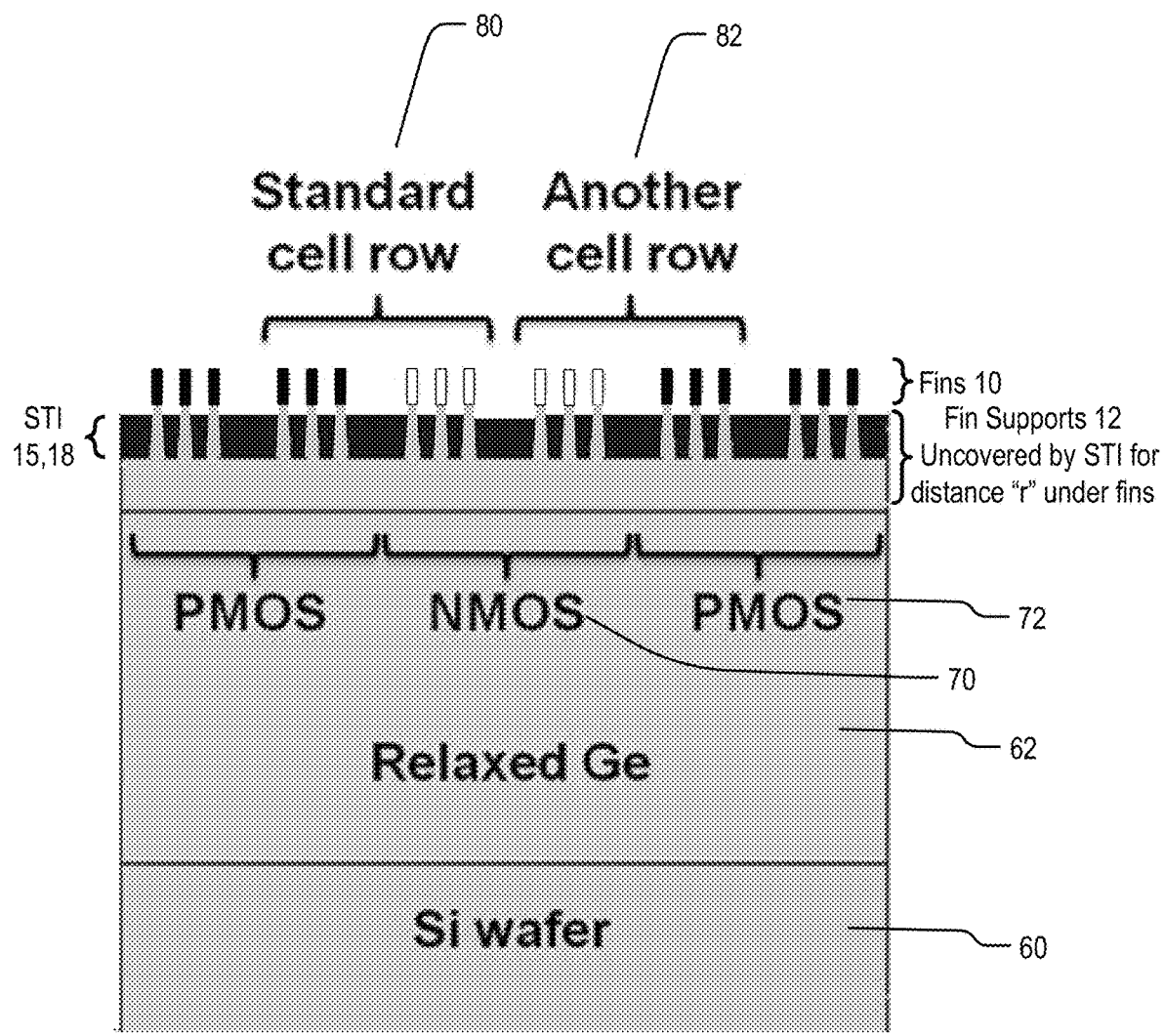
FIG. 16 shows the example wafer of FIG. 4 after patterning fins and fin supports, and isolation oxide in between adjacent fin supports.

FIG. 16 shows the example wafer of FIG. 4 after patterning fins and fin supports, and isolation oxide in between adjacent fin supports.

The wafer generally corresponds to the wafer of FIG. 5. However, FIG. 5 shows FinFETs with nominal STI, or shallow trench isolation silicon oxide having an upper surface beginning at the heterojunction between the fins 10 and the fin supports 12. FIG. 16 shows FinFETs with recessed STI, or shallow trench isolation silicon oxide having an upper surface beginning on the side of the fin support below the heterojunction.

In one embodiment, a wafer is fabricated with the fins and fin supports from different crystalline semiconductor materials. Such a wafer can be made by one party, and provided to another party that can complete the remaining fabrication.

U.S. Pat. No. 7,190,050 and U.S. patent application Ser. No. 13/717,532 are hereby incorporated by reference herein, including all of the variations described herein. In various embodiments, all of the variations described in U.S. Pat. No. 7,190,050 and U.S. patent application Ser. No. 13/717,532 are modified to include the FinFETs described herein at any stage of the process flow. For example, the wafers in U.S. Pat. No. 7,190,050 and U.S. patent application Ser. No. 13/717,532 are modified with fins, fin supports, isolation dielectric, gates, and/or gate dielectrics as disclosed herein.

Figure 17:
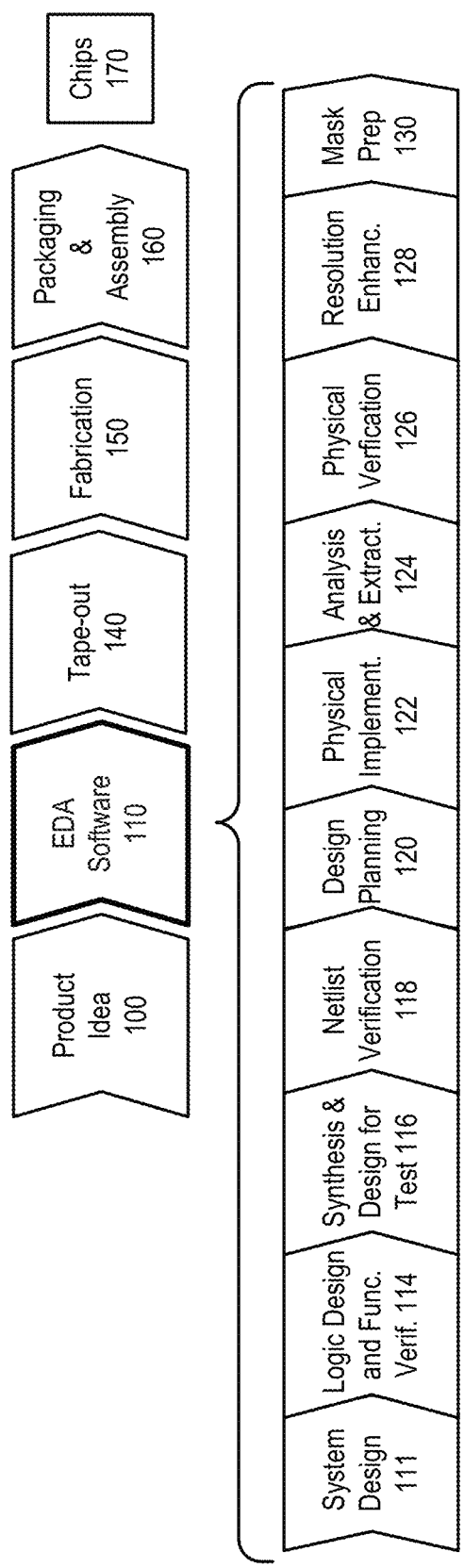
FIG. 17 shows a simplified representation of an illustrative integrated circuit design flow incorporating features of the technology.

FIG. 17 shows a simplified representation of an illustrative integrated circuit design flow incorporating features of the technology. The FinFETs described herein can be incorporated at any part of the flow.

At a high level, the process starts with the product idea (step 100) and is realized in an EDA (Electronic Design Automation) software design process (step 110). When the design is finalized, it can be taped-out (step 140). After tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 111): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include the Astro and IC Compiler products.

Analysis and extraction (step 124): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape out" data for production of masks for lithographic use to produce finished chips. Example EDA software products from Synopsys, Inc. that can be used at this step include the CATS(R) family of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides the "tape-out" data for production of masks for lithographic use to produce finished chips. Example EDA software products from Synopsys, Inc. that can be used at this step include the CATS(R) family of products.

A typical integrated circuit manufacturing flow also includes a parallel flow, as follows:

(1) Develop individual process steps for manufacturing the integrated circuit. This can be modeled with the Synopsys tools "Sentaurus Process", "Sentaurus Topography", and "Sentaurus Lithography". The input information here include masks or layout information, and process conditions like temperature, reactor ambient, implant energy, etc. The output information is the final geometry or doping profiles or stress distribution. Aspects of the invention can be used in this step of the manufacturing flow.

(2) Integrate the individual process steps into the complete process flow. This can be modeled with the Synopsys tool "Sentaurus Process". The input information here includes the layout information and the collection of the process steps in the appropriate sequence. The output includes the geometry, the doping profiles, and the stress distribution for the transistors and the space in between the transistors. Aspects of the invention can be used also in this step of the manufacturing flow.

(3) Analyze performance of the transistor manufactured with this process flow. This can be done with the Synopsys tool "Sentaurus Device". The input information here includes the output of step (2) and the biases applied to transistor terminals. The output information includes the currents and capacitances for each bias combination.

(4) If necessary, modify the process steps and the process flow to achieve the desired transistor performance. This can be done iteratively by using the Synopsys tools mentioned above.

Once the process flow is ready, it can be used for manufacturing multiple circuit designs coming from various designers in various companies. The EDA flow 111-130 will be used by such designers. The parallel flow described here is used at a foundry to develop a process flow that can be used to manufacture designs coming from the designers. A combination of the process flow and the masks made from step 130 are used to manufacture any particular circuit. If the designers are at a different company, e.g. a fabless company, then usually it is the foundry that performs this parallel process flow whereas the process steps are performed typically by the fabless company. If the integrated circuit is manufactured at an IDM (integrated device manufacturer) company instead of the combination of a fabless company and a foundry, then both parallel flows described above are done at the same IDM company.

There is also a bridge between these tools and the 112-130 EDA tools. The bridge is a Synopsys tool "Seismos" that applies compact proximity models for particular circuit design and layout to obtain netlist with instance parameters for each individual transistor in the circuit as a function of its neighborhood and stress, including material conversion stress. This netlist is used in the analysis step 124.

Figure 18:
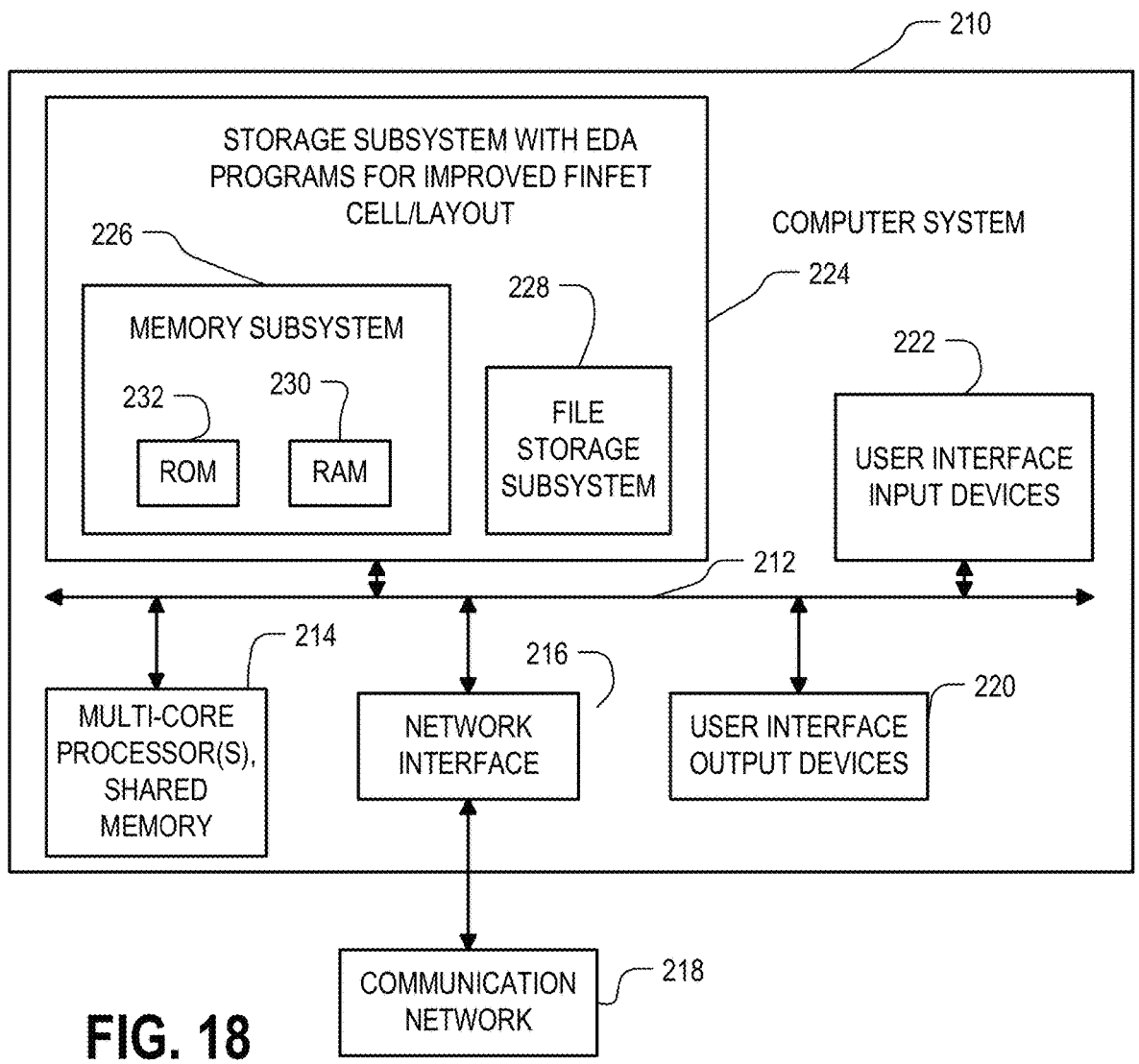
FIG. 18 is a simplified block diagram of a computer system that implements software incorporating aspects of the present technology.

FIG. 18 is a simplified block diagram of a computer system 110 that implements software incorporating aspects of the present invention. While the present paper indicates individual steps carrying out specified operations, it will be appreciated that each step is actually implemented with software instructions that cause the computer system 110 to operate in the specified manner. The group of software instructions and data to implement a particular step, in conjunction with the processing subsystem and other components of the computer system which enable such software instructions to be executed, constitute a module which implements the particular step.

Computer system 210 typically includes a processor subsystem 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, in other embodiments, communication network 218 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 210 or onto computer network 218.

User interface output devices 220 may include a display subsystem, a printer, a fax machine, or nonvisual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 110 to the user or to another machine or computer system.

Non-transitory storage subsystem 224 stores the basic programming and data constructs that provide the functionality of certain embodiments of the present invention. For example, the various modules implementing the functionality of certain embodiments of the invention may be stored in storage subsystem 224. Some examples are EDA programs for a cell or layout including FinFETs as described herein. These software modules are generally executed by processor subsystem 214. Storage subsystem 224 also represents storage accessible to the computer system on which the various software mentioned herein are stored. In another embodiment some or all of the software is located on storage accessible to the computer system via the network 218.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 228. The host memory 226 contains, among other things, computer instructions which, when executed by the processor subsystem 214, cause the computer system to operate or perform functions as described herein. As used herein, processes and software that are said to run in or on "the host" or "the computer", execute on the processor subsystem 214 in response to computer instructions and data in the host memory subsystem 226 including any other local or remote storage for such instructions and data.

Figure 18A:
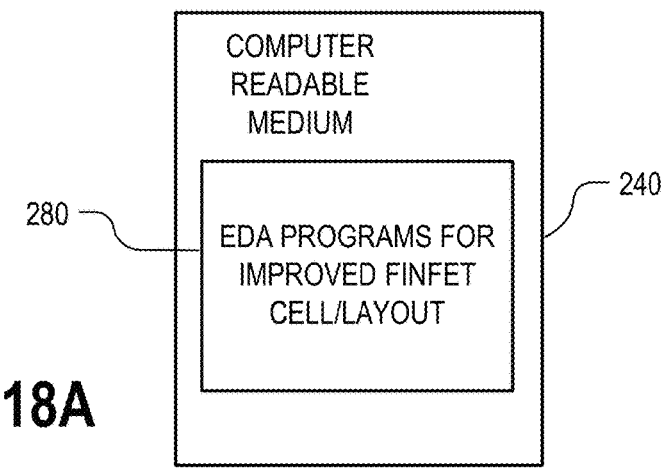
FIG. 18A showing a computer readable medium with EDA programs for improved FinFET cell/layout.

FIG. 18A shows a non-transitory computer readable medium which can be any of the non-transitory memories discussed in connection with the storage subsystem 224.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer system 210 itself can be of varying types including a personal computer, a portable computer, a workstation, a computer terminal, a network computer, a television, a mainframe, a server farm, or any other data processing system or user device. Due to the ever changing nature of computers and networks, the description of computer system 210 is intended only as a specific example for purposes of illustrating certain embodiments of the present invention. Many other configurations of computer system 210 are possible having more or less components than the computer system depicted.

As mentioned, some of the structures herein can advantageously utilize stress engineering to adjust the device properties in the fins of the FinFET transistors on the fin supports. The technology disclosed herein includes a FinFET-based CMOS device structure using group IV elements and alloys for device dimensions in a 7 nm technology node. Inclusion of Sn-based alloys GeSn and SiGeSn significantly expands the design space for continued band gap and stress engineering in a Si-compatible platform. A device structure described herein leverages the use of a common buffer layer for NAND P-channel devices to alleviate difficulties in integration of different channel materials. CMOS performance is evaluated through device property simulations.

A fabrication process to build the device structure can be performed by simulation. The process starts with Si (001) substrate. Relaxed-Ge is grown on the substrate using well-established heteroepitaxy methods that achieve <$10^6$/cm$^2$ threading dislocation density in the top Ge region. A layer of $Si_{0.32}GeSn_{0.08}$, lattice-matched to Ge, serves as a common strain-relaxed buffer (SRB) tor selective epitaxy of p and n MOSFET channel materials: GeSn (4% Sn) and Ge, respectively. SiGeSn SRB is chosen due to its larger band gap than Ge (0.87 eV vs. 0.66 eV). Various steps in subsequent fabrication of MOSFETs in accordance with '7 nm' design rules are illustrated in FIGS. 6-12. After fin patterning and dummy gate, spacer formation, S/D regions are recessed and in-situ doped GeSn (8% Sn) (PMOS) and $Si_{0.3}Ge_{0.7}$ (NMOS) are epitaxially re-grown. S/D regions of neighboring fins do not merge. The channel is undoped. Compressive stress for hole mobility enhancement is achieved through a combination of growth of GeSn (4% Sn) on SiGeSn SRB and use of GeSn (8% Sn) as PMOS S/D. Similarly, tensile strain for boosting NMOS drive current is obtained by employing $Si_{0.3}Ge_{0.7}$ S/D stressors. Note that dummy gate removal and replacement metal gate formation amplifies the channel stress quite significantly. This configuration of SRB, channel and S/D materials achieves final longitudinal stress of 1.1 GPa. In addition to providing beneficial channel stress, high in-situ B doping in GeSn and P doping in SiGe are used to lower the parasitic S/D series and contact resistances.

Several options exist for selecting the S/D stressor material and SRB to individually tune the channel stress in p and n MOSFETs: (a) Si content in NMOS S/D stressor, Sn content in PMOS S/D stressor; (b) Lattice constant of the common SRB. Channel material kept invariant: GeSn (4% Sn) (PMOS) and Ge (NMOS), '7 nm' design rules. This enhanced engineering flexibility is a salient feature of the CMOS design methodology discussed here.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method comprising:
   developing at least part of an integrated circuit fabrication process, including determining geometry of a semiconductor device structure, wherein the determining comprises:
   simulating, by a computer system, epitaxial formation of a first region and a second region above a common buffer layer of the device structure, the first region formed of a first crystalline semiconductor material, the second region formed of a second crystalline semiconductor material different from the first semiconductor material, and the common buffer layer formed of a third crystalline semiconductor material;
   simulating, by the computer system, formation of a first fin from the first region, the first fin including a first channel region of a first transistor between a source region of the first transistor and a drain region of the first transistor, the first fin on a first fin support;
   simulating, by the computer system, formation of the first fin support from the common buffer layer, the first crystalline semiconductor material of the first fin and the third crystalline semiconductor material of the first fin support forming a first heterojunction in between; and
   simulating, by the computer system, formation of a second fin from the second region, the second fin including a second channel region of a second transistor between a source region of the second transistor and a drain region of the second transistor, the second fin on a second fin support; and
   simulating, by the computer system, formation of the second fin support from the common buffer layer, the second crystalline semiconductor material of the second fin and the third crystalline semiconductor material of the second fin support forming a second heterojunction in between, the device structure having geometry determined from geometries of the first fin, the second fin, and the first and second fin supports.

2. The method of claim 1, wherein the third crystalline semiconductor material is SiGeSn.

3. The method of claim 2, wherein the third crystalline semiconductor material is lattice-matched to an underlying semiconductor layer.

4. The method of claim 3, wherein the underlying semiconductor layer is germanium.

5. The method of claim 1, wherein the first crystalline semiconductor material has a first bandgap, the second semiconductor material has a second bandgap, and the third semiconductor material has a third bandgap, the third bandgap wider than the first bandgap and the second bandgap.

6. The method of claim 1, wherein the third crystalline semiconductor material of the first fin support induces a first stress in the first channel region of the first transistor and the third crystalline semiconductor material of the second fin support induces a second stress in the second channel region of the second transistor, the first stress different from the second stress.

7. The method of claim 6, wherein the first stress is tensile and the second stress is compressive.

8. The method of claim 1, wherein the first transistor is an n-type transistor and the second transistor is a p-type transistor.

9. The method of claim 1, further comprising:
simulating formation of a first isolation oxide running along opposite sides of the first fin support and electrically isolating the first fin support from adjacent fin supports, the first isolation oxide positioned only below the first heterojunction;
simulating formation of forming a first gate dielectric including: (i) a first part overlying sides and top of the first fin, the first part conformally covering the first fin and having a first thickness and (ii) a second part conformally covering the first fin support between the first heterojunction and the first isolation oxide and having about the first thickness; and
simulating formation of forming a first gate conformally covering the first part and the second part of the first gate dielectric,
the device structure having geometry determined further from geometries of the first isolation oxide, the first gate dielectric, and the first gate.

10. The method of claim 1, further comprising including in the integrated circuit fabrication process, process steps simulated in the method of claim 1.

11. A method comprising:
developing at least part of an integrated circuit fabrication process, including determining properties of a candidate semiconductor device structure, wherein the determining comprises:
simulating, by a computer system, fabrication of the candidate semiconductor device structure; and
determining, by the computer system, properties of the candidate semiconductor device structure by device simulation,
wherein the candidate semiconductor device structure comprises:
a first fin formed of a first crystalline semiconductor material, the first fin on a first fin support formed of a third crystalline semiconductor material, wherein the first crystalline semiconductor material and the third crystalline semiconductor material meet at a first heterojunction; and
a second fin formed of a second crystalline semiconductor material different from the first crystalline semiconductor material, the second fin on a second fin support formed of the third crystalline semiconductor material, wherein the second crystalline semiconductor material and the third crystalline semiconductor material meet at a second heterojunction,
wherein the first fin support and the second fin support are continuous with a common buffer layer of the third crystalline semiconductor material,
wherein the first crystalline semiconductor material has a first bandgap, the second semiconductor material has a second bandgap, and the third crystalline semiconductor material has a third bandgap, the third bandgap wider than the first bandgap and wider than the second bandgap.

12. The method of claim 11, wherein the third crystalline semiconductor material is SiGeSn.

13. The method of claim 12, wherein the third crystalline semiconductor material is lattice-matched to an underlying semiconductor layer.

14. The method of claim 13, wherein the underlying semiconductor layer is germanium.

15. The method of claim 11, wherein the third crystalline semiconductor material of the first fin support induces a first stress in the first fin and the third crystalline semiconductor material of the second fin support induces a second stress in the second fin, the first stress different from the second stress.

16. The method of claim 15, wherein the first stress is tensile and the second stress is compressive.

17. The method of claim 11, wherein the first fin includes a first channel region of a first transistor between a source region of the first transistor and a drain region of the first transistor,
and wherein the second fin includes a second channel region of a second transistor between a source region of the second transistor and a drain region of the second transistor.

18. The method of claim 11, wherein simulating fabrication of the candidate semiconductor device structure comprises:
simulating epitaxial formation of a first region and a second region above the common buffer layer;
simulating formation of the first fin from the first region, the first fin on the first fin support;
simulating formation of the first fin support from the common buffer layer;
simulating formation of the second fin from the second region, the second fin on the second fin support; and
simulating formation of the second fin support from the common buffer layer.

19. The method of claim 18, wherein the first crystalline semiconductor material has a first bandgap, the second semiconductor material has a second bandgap, and the third semiconductor material has a third bandgap, the third bandgap wider than the first bandgap and the second bandgap.

20. The method of claim 18, wherein the third crystalline semiconductor material of the first fin support induces a first stress in a first channel region of a first transistor and the third crystalline semiconductor material of the second fin support induces a second stress in a second channel region of a second transistor, the first stress different from the second stress.

21. The method of claim 20, wherein the first stress is tensile and the second stress is compressive.

22. The method of claim 17, wherein the first transistor is an n-type transistor and the second transistor is a p-type transistor.

23. The method of claim 17, wherein determining properties of the candidate semiconductor device structure by device simulation comprises evaluating an on-current of one of the first and second transistors using a ballistic MOSFET model.

24. The method of claim 17, wherein determining properties of the candidate semiconductor device structure by device simulation comprises evaluating an off-current of one of the first and second transistors.

25. The method of claim 11, further comprising including in the integrated circuit fabrication process, process steps simulated in the simulated fabrication of the candidate semiconductor device structure.

* * * * *